(12) United States Patent
Zihlmann

(10) Patent No.: US 12,338,944 B2
(45) Date of Patent: Jun. 24, 2025

(54) POSITIONING DEVICE FOR POSITIONING A MOVABLE ELEMENT

(71) Applicant: Schneeberger Holding AG, Roggwil (CH)

(72) Inventor: Jean-Claude Zihlmann, Schoetz (CH)

(73) Assignee: Schneeberger Holding AG, Roggwil (CH)

( * ) Notice: Subject to any disclaimer, the term of this patent is extended or adjusted under 35 U.S.C. 154(b) by 135 days.

(21) Appl. No.: 18/382,665

(22) Filed: Oct. 23, 2023

(65) Prior Publication Data
US 2024/0167616 A1      May 23, 2024

(30) Foreign Application Priority Data

Nov. 22, 2022  (EP) ..................................... 22208725

(51) Int. Cl.
*F16M 11/20*       (2006.01)
*F16C 32/06*       (2006.01)

(52) U.S. Cl.
CPC ......... *F16M 11/2085* (2013.01); *F16C 32/06* (2013.01); *F16M 11/2092* (2013.01)

(58) Field of Classification Search
CPC ............ F16M 11/2085; F16M 11/2092; F16C 32/06; G03F 7/70716; G03F 7/70816; H01L 21/68; B23Q 1/38
USPC ...................................................... 248/429
See application file for complete search history.

(56) References Cited

U.S. PATENT DOCUMENTS

| | | | |
|---|---|---|---|
| 5,991,005 A | 11/1999 | Horikawa et al. | |
| 11,466,809 B2 | 10/2022 | Kobel | |
| 2003/0098965 A1 | 5/2003 | Binnard et al. | |
| 2003/0113043 A1* | 6/2003 | Uchimi | G03F 7/70816 384/12 |

(Continued)

FOREIGN PATENT DOCUMENTS

| | | |
|---|---|---|
| CN | 113977294 A | 1/2022 |
| EP | 0 503 712 A1 | 9/1992 |

(Continued)

OTHER PUBLICATIONS

European Search Report dated Apr. 28, 2023 in European Application No. 22208725.6, with English Translation of relevant parts.

*Primary Examiner* — Christopher Garft
(74) *Attorney, Agent, or Firm* — Collard & Roe, P.C.

(57) ABSTRACT

The positioning device for positioning a movable element includes a base including a flat guide surface parallel to first and second directions, and a Gantry beam in the second direction spaced from the guide surface. A Gantry drive for moving the beam relative to the base in the first direction, includes two first linear axes extending in the first direction, each including a linear drive. A first air bearing device includes first and second air bearing arrangements including first and second horizontal air bearings for guiding first and second beam ends on guide surface first and second sections, respectively, a third air bearing arrangement on a beam central section including at least third and fourth horizontal air bearings for guiding the beam central section on a guide surface third section and including at least one lateral air bearing for guiding the beam on a guide beam flat side surface.

20 Claims, 9 Drawing Sheets

(56) References Cited

U.S. PATENT DOCUMENTS

| | | | | |
|---|---|---|---|---|
| 2007/0068231 A1* | 3/2007 | Makino | ............... | G03F 7/70725 |
| | | | | 73/65.07 |
| 2010/0158645 A1* | 6/2010 | Makino | ................... | H01L 21/68 |
| | | | | 414/222.07 |
| 2015/0280529 A1* | 10/2015 | Maamari | ................ | H02K 41/02 |
| | | | | 310/12.06 |

FOREIGN PATENT DOCUMENTS

| | | | |
|---|---|---|---|
| EP | 3 557 326 | A1 | 10/2019 |
| EP | 3 670 067 | A1 | 6/2020 |
| JP | 2002-189090 | A | 7/2002 |

* cited by examiner

POSITIONING DEVICE FOR POSITIONING A MOVABLE ELEMENT

CROSS REFERENCE TO RELATED APPLICATIONS

Applicant claims priority under 35 U.S.C. § 119 of European Application No. 22208725.6 filed Nov. 22, 2022, the disclosure of which is incorporated by reference.

BACKGROUND OF THE INVENTION

1. Field of the Invention

The invention relates to a positioning device for positioning a movable element. The invention relates in particular to a positioning device for positioning a movable element, which is formed to move the movable element in a first direction and in a second direction with the help of a movement means in Gantry design with respect to a flat guide plane formed on a base.

2. Description of the Related Art

A plurality of positioning devices for positioning a movable element, which are suitable to move a movable element with respect to a flat guide surface formed on a base in a first direction and in a second direction, are already known. Positioning devices of this type are used, for example, in the semiconductor industry in order to bring, for example, semiconductor wafers into different positions during process steps for producing microstructures on a surface of a semiconductor wafer or to position semiconductor wafers for metrological purposes relative to measuring devices (for example for the inspection and/or for the metrological characterization of microstructures on surfaces of semiconductor wafers).

For example with respect to industrial applications for performing process steps for the production of microstructures or for the inspection and/or for the meteorological characterization of microstructures, there is a need for positioning devices, which are suitable to move a movable element (for example a platform or a table, respectively, for receiving an object to be positioned) in a first direction and in a second direction (i.e. two-dimensionally relative to a specified plane) at the highest possible speed and optionally at the highest possible acceleration (e.g. in the range of 2 g or more), and to thereby position it repeatedly and reproducibly in specified positions, in each case with a high precision (i.e. with an accuracy in the sub-micrometer range).

In order to provide for a quick and precise positioning of a movable element in a first direction and in a second direction, positioning devices of the above-mentioned type often comprise a base (e.g. a block made of granite) comprising a flat guide surface, which is arranged parallel to a first direction and parallel to a second direction, and a movement device for moving the movable element with respect to the flat guide surface of the base. A movement device of the above-mentioned type can thereby have, for example, a first movement means in Gantry design, which comprises a Gantry beam arranged above the flat guide surface and extending in the second direction at a distance from the flat guide surface, and a Gantry drive for moving the Gantry beam relative to the base in the first direction. The Gantry beam thereby has a first end and a second end located opposite the first end, wherein the Gantry drive comprises two first linear axes extending in the first direction, each comprising a linear drive, and the two first linear axes extending in the first direction are designed in such a way that the linear drive of one of the two first linear axes is connected to the first end of the Gantry beam, and the linear drive of the other one of the two first linear axes is connected to the second end of the Gantry beam.

In order to provide for a movement of the movable element in the first direction and in the second direction, the movable element is thereby mounted on the Gantry beam in such a way that the movable element is linearly movable in the second direction on the Gantry beam, wherein the Gantry beam has a second linear axis extending in the second direction and comprising a linear drive connected to the movable element for moving the movable element in the second direction.

In order to make it possible that the movable element can be repeatedly and reproducibly positioned in specified positions, each with a large precision (i.e. with an accuracy in the range of nanometers) relative to the guide surface of the base, it can be advantageous for many applications to support the Gantry beam of the first movement means on the base upon a movement along the flat guide surface of the base by means of air bearings, and, for this purpose, to provide an air bearing means comprising several air bearings connected to the Gantry beam for guiding the Gantry beam on the flat guide surface of the base. The air bearings have the effect that, upon a movement of the Gantry beam relative to the base, surface regions of the Gantry beam and of the guide surface of the base in the region of the air bearings located opposite one another and moved relative to one another are each separated by means of air cushions and can thus be moved relative to one another without contact. It is in particular ensured thereby that a mechanical friction (static friction and/or sliding friction) between surface regions of the Gantry beam and of the guide surface of the base located opposite one another is prevented, and effects are avoided, which are based on a mechanical friction between solid bodies that are moved relative to one another, and which generally negatively impact the accuracy of a positioning of solid bodies that are moved relative to one another (stick-slip effect or slip stick, respectively, of the solid bodies that are moved relative to one another).

With respect to many applications of positioning devices of the above-mentioned type, there is a need to form positioning devices of this type in a "highly dynamic manner", so that they are suitable to move a movable element with a large acceleration (e.g. in the range of 2 g or more). In the case of a highly dynamic positioning device of the above-mentioned type, an essential requirement is that the positioning device and in particular the Gantry beam of the first movement means is deformed as little as possible as a result of the inertia during a large acceleration of the Gantry beam by means of the linear drives of the two first linear axes in the first direction as well as in response to a large acceleration of the movable element by means of the linear drive of the second linear axis in the second direction, and should thus have the largest possible stiffness with respect to a deformation in the form of a bending and/or a torsion about the first direction and/or the second direction.

With respect to positioning devices of the above-mentioned type, in the case of which the Gantry beam is guided on the base by means of air bearings and which are formed in a highly dynamic manner, structures have in particular become known, which have a "flat" configuration in such a way that the two linear drives of the first linear axes are arranged, if possible, at the height of the center of mass of all parts of the positioning device, which are moved by means of these two linear drives, in order to maximize the dynamic torsional stiffness (according to a natural frequency) of the Gantry beam. The latter is connected to the fact that, the larger the vertical distance (i.e. perpendicular to the flat guide surface of the base) between the force vector of the linear drives of the two first linear axes acting on the Gantry beam and the center of mass of all parts of the positioning device, which are moved by means of the linear drives of the two first linear axes, the stronger the Gantry beam will twist in response to an accelerated movement in the first direction due to the inertia of the parts of the positioning device, which are moved by means of the linear drives of the two first linear axes, which, in a disadvantageous manner, lengthens the setting time, which the Gantry beam requires in order to reach a stable position again after an acceleration of the Gantry beam in the first direction.

A positioning device of the above-mentioned type, which is formed in a highly dynamic manner, in the case of which the Gantry beam is guided on a flat guide surface of a base by means of air bearings, is known, for example, from the publication CN 113977294 A. This positioning device is designed for a precise positioning of a movable element in the form of a movable table for receiving a workpiece (for example for a micro-processing of the workpiece). The Gantry beam of this positioning device is guided on a flat guide surface on the top side of the base by means of two horizontal air bearings, wherein one of the two horizontal air bearings is arranged on the first end of the Gantry beam, in order to support or to guide, respectively, the first end of the Gantry beam on the flat guide surface of the base upon a movement in the first direction, and wherein the other one of the two horizontal air bearings is arranged on the second end of the Gantry beam, in order to support or to guide, respectively, the second end of the Gantry beam on the flat guide surface on the top side of the base upon a movement in the first direction. The movable table to be positioned is movable in the second direction (longitudinal direction of the Gantry beam) by means of the linear drive of the second linear axis arranged on the Gantry beam and is likewise supported or guided, respectively, on the top side of the base by means of horizontal air bearings on the flat guide surface. In order to laterally guide the Gantry beam upon a movement in the first direction, a lateral guide surface is provided, which extends parallel to the first direction and perpendicular to the flat guide surface of the base. With respect to the flat guide surface on the top side of the base, the lateral guide surface is arranged approximately at the same height as the Gantry beam in such a way that the lateral guide surface is placed laterally next to the Gantry beam in the vicinity of one of the ends of the Gantry beam at a distance from this one end of the Gantry beam. The Gantry beam is guided on the one lateral guide surface by means of a lateral air bearing, which, for this purpose, is fastened on a side surface of the Gantry beam to the one end of the Gantry beam, which is arranged in the vicinity of the lateral guide surface. The arrangement of the lateral guide surface (i.e. laterally next to the Gantry beam in the vicinity of one of the ends of the Gantry beam at a distance from this one end of the Gantry beam) provides for a maximization of the dynamic bending stiffness of the Gantry beam in response to an acceleration of the movable table in the second direction (corresponding to the longitudinal direction of the Gantry beam). The latter is associated with the fact that, the larger the distance between the location at which the Gantry beam is guided on the one lateral guide surface by means of the lateral air bearing, and the center of mass of the movable table arranged on the Gantry beam, the larger the bending moment becomes, which acts on the Gantry beam or the lateral air bearing, respectively, in response to an acceleration of the movable table in the second direction, which reduces the bending stiffness of the Gantry beam and lengthens, in a disadvantageous manner the setting time, which the Gantry beam requires in order to reach a stable position again after an acceleration of the movable table in the second direction. To balance tolerances and different speeds of the two linear drives of the two first linear axes in response to a movement of the Gantry beam in the first direction, the lateral air bearing is connected to the one end of the Gantry beam via a solid body joint (which is placed between the lateral air bearing and the one end of the Gantry beam) in such a way that the lateral air bearing can be pivoted relative to the Gantry beam.

Known positioning devices of the above-mentioned type, which are formed in a highly dynamic manner, in the case of which the Gantry beam and the movable element, which can be moved in the longitudinal direction of the Gantry beam, is each guided on a flat guide surface of a base (e.g. the above-described positioning device known from the publication CN 113977294 A) by means of air bearings, have the disadvantage that these positioning devices—compared to the distances, over which the movable element to be positioned can be moved relative to the flat guide surface of the base by means of the respective positioning devices, have a relatively large space requirement (with respect to a base surface parallel to the first direction and to the second direction, over which the respective parts of the positioning device are arranged to be spatially distributed), due to the spatial arrangement of the two first linear axes and the second linear axis and the spatial arrangement of the air bearings for guiding the Gantry beam and the movable element on the base. The air bearings arranged on the Gantry beam for guiding the Gantry beam on the base and the air bearings arranged on the movable element for guiding the movable element on the base are thereby generally arranged relative to one another in such a way that the movable element cannot be moved along the entire length of the Gantry beam due to the space requirement of the respective air bearings in the second direction, but only over a portion of the length of the Gantry beam.

SUMMARY OF THE INVENTION

The present invention is based on the object of avoiding the mentioned disadvantages and to create a positioning device, which is formed in a highly dynamic manner, for positioning a movable element, in the case of which the Gantry beam is guided on a flat guide surface of a base by means of air bearings and which is constructed to be relatively compact (with a relatively small base surface, over which the respective parts of the positioning device are arranged so as to be spatially distributed) and which is additionally suitable to move the movable element with a relatively large acceleration over a relatively large surface (compared to the base surface of the positioning device).

This object is solved by means of a positioning device for positioning a movable element comprising the features according to the invention.

The positioning device comprises a base comprising a flat guide surface, which is arranged parallel to a first direction and parallel to a second direction, and a first movement means in Gantry design, which first movement means comprises a Gantry beam, which is arranged above the flat guide surface and which extends in the second direction at a distance from the flat guide surface, and a Gantry drive for moving the Gantry beam relative to the base in the first direction, wherein the Gantry beam has a first end and a second end located opposite the first end, and the Gantry drive comprises two first linear axes extending in the first direction, each comprising a linear drive. The linear drive of one of the two first linear axes is thereby connected to the first end of the Gantry beam, and the linear drive of the other one of the two first linear axes is connected to the second end of the Gantry beam.

The positioning device additionally comprises a first air bearing means comprising several air bearings connected to the Gantry beam for guiding the Gantry beam on the flat guide surface of the base.

The movable element is mounted on the Gantry beam in such a way that the movable element on the Gantry beam is linearly movable in the second direction, wherein the Gantry beam has a second linear axis extending in the second direction comprising a linear drive connected to the movable element for moving the movable element in the second direction.

The first air bearing means of the positioning device has a first air bearing arrangement, which comprises at least one first horizontal air bearing arranged on the first end of the Gantry beam for guiding the first end of the Gantry beam on a first section of the flat guide surface extending in the first direction, which at least one first horizontal air bearing is preloaded with respect to the first section of the flat guide surface.

The first air bearing means of the positioning device additionally has a second air bearing arrangement, which comprises at least one second horizontal air bearing arranged on the second end of the Gantry beam for guiding the second end of the Gantry beam on a second section of the flat guide surface extending in the first direction, which at least one second horizontal air bearing is preloaded with respect to the second section of the flat guide surface.

According to the invention, the first air bearing means of the positioning device additionally has a third air bearing arrangement, which comprises at least one third horizontal air bearing and at least one fourth horizontal air bearing, wherein the at least one third horizontal air bearing and the at least one fourth horizontal air bearing are arranged on a central section of the Gantry beam between the first end of the Gantry beam and the second end of the Gantry beam, so that the central section of the Gantry beam is guided on a third section of the flat guide surface by means of the third horizontal air bearing and of the fourth horizontal air bearing, which third section of the flat guide surface extending in the first direction and, with respect to the second direction, being arranged between the first section of the flat guide surface and the second section of the flat guide surface, wherein the at least one third horizontal air bearing and the at least one fourth horizontal air bearing have a distance relative to one another in the first direction, and the at least one third horizontal air bearing and the at least one fourth horizontal air bearing are preloaded with respect to the third section of the flat guide surface.

The positioning device is additionally formed in such a way that a guide beam extending in the first direction is arranged on the base next to the third section of the flat guide surface, the guide beam having a flat side surface, which extends parallel to the first direction and parallel to a third direction, which third direction being directed essentially perpendicular to the flat guide surface. The third air bearing arrangement therefore comprises at least one lateral air bearing arranged on the central section of the Gantry beam for guiding the Gantry beam on the one flat side surface of the guide beam, wherein the at least one lateral air bearing is preloaded with respect to the one flat side surface of the guide beam.

It is important to point out that the wording "parallel to a third direction directed essentially perpendicular to the flat guide surface" is to be interpreted in such a way in this context that the "third direction" can be directed exactly parallel to a straight line extending "perpendicular to the flat guide surface", but does not necessarily have to be directed exactly parallel to a straight line extending "perpendicular to the flat guide surface", but can also be inclined at an angle in the range of 0°-5° with respect to a straight line extending "perpendicular to the flat guide surface".

In this context, the term "horizontal air bearing" identifies a "bearing means", which is formed to create an air cushion between the flat guide surface of the base and the bearing means by means of a release of compressed air, and to hold the bearing means in this way at a distance from the flat guide surface of the base.

In this context, the term "lateral air bearing" identifies a "bearing means", which is formed to create an air cushion between the flat side surface of the guide beam and the bearing means by means of a release of compressed air, and to hold the air bearing means in this way at a distance from the flat side surface of the guide beam.

In this context, the term "horizontal air bearing, which is preloaded with respect to a section of the flat guide surface", identifies a "bearing means", which is formed to create an air cushion between the flat guide surface of the base and the bearing means by means of a release of compressed air, and which additionally comprises technical means, which are suitable to generate a force of attraction ("preloading force"), which acts on the bearing means and which is directed to the respective section of the flat guide surface, so that the bearing means is held in a stable position with respect to the flat guide surface by means of a cooperation of the air cushion and the generated force of attraction or preloading force, respectively, in which stable position the bearing means has a distance with respect to the flat guide surface (corresponding to the thickness of an air gap between the bearing means and the flat guide surface, in which the air cushion created by means of the release of compressed air is formed). Corresponding technical means for preloading an air bearing are known per se and will be specified below. Due to a cooperation of the preloading force directed to the flat guide surface and due to the compressed air released by the bearing means, the air cushion formed in the air gap between the bearing means and the flat guide surface has the effect of a "spring element", which can be deformed elastically in a direction perpendicular to the flat guide surface: The thickness of the air gap, which is formed between the bearing means and the flat guide surface due to the presence of the air cushion, can thus be changed only by means of a force, which acts on the bearing means and which is directed perpendicular to the flat guide surface (i.e. increased or decreased as a function of the respective direction of the force), wherein the air cushion has a "stiffness" with respect to a change of the thickness of the air gap. The stiffness is thereby defined as the ratio of the force, which acts on the bearing means and which is directed perpendicular to the flat guide surface, to the size of the change of the thickness of the air gap, which is caused by the force acting on the bearing means. The size of the stiffness of the air bearing is thereby a function of, for example, the respective size of the preloading force, so that the stiffness of the air bearing can be varied within a certain range as needed (by selecting a certain size of the preloading force). The stiffness of the air bearing with respect to a force directed perpendicular to the flat guide surface can therefore advantageously be "maximized" by selection of a certain preloading force, in order to hold the bearing means particularly effectively in a stable position with respect to the flat guide surface.

In this context, the expression "lateral air bearing, which is preloaded with respect to the one flat side surface of the guide beam" therefore identifies a "bearing means", which is formed to create an air cushion between the flat side surface of the guide beam by means of a release of compressed air, and which additionally comprises technical means, which are suitable to generate a force of attraction ("preloading force"), which acts on the bearing means and which is directed to the flat side surface of the guide beam, so that the bearing means is held in a stable position with respect to the flat side surface of the guide beam by means of a cooperation of the air cushion and the generated force of attraction or preloading force, respectively, in which stable position the bearing means has a distance with respect to the flat side surface of the guide beam (corresponding to the thickness of an air gap between the bearing means and the flat side surface of the guide beam, in which the air cushion created by means of the release of compressed air is formed). Corresponding technical means for preloading the air bearing will be specified below. The air cushion formed in the air gap between the bearing means and the flat side surface of the guide beam has the effect of a "spring element", which can be deformed elastically in a direction perpendicular to the flat side surface: The thickness of the air gap, which is formed between the bearing means and the flat side surface due to the presence of the air cushion, can thus be changed only by means of a force, which acts on the bearing means and which is directed perpendicular to the flat side surface (i.e. increased or decreased as a function of the respective direction of the force), wherein the air cushion has a stiffness with respect to a change of the thickness of the air gap. The size of the stiffness of the air cushion is thereby a function of, for example, the respective size of the preloading force, so that the stiffness of the air bearing can be varied within a certain range as needed (by selecting a certain size of the preloading force). The stiffness of the air bearing with respect to a force directed perpendicular to the flat side surface can therefore advantageously be "maximized" by selection of a certain preloading force, in order to hold the bearing means particularly effectively in a stable position with respect to the flat side surface.

A combination of linear guide and linear drive shall be understood here in each case as "linear axis". The horizontal air bearings of the first air bearing means and the lateral air bearings of the first air bearing means interact with the flat guide surface of the base and the flat side surface of the guide beam in such a way that the Gantry beam is guided by means of the horizontal air bearings and the lateral air bearings of the first air bearing means in such a way that the Gantry beam is linearly movable in the first direction. This linear guide of the Gantry beam, in combination with a respective one of the two linear drives, which are each connected to one of the two ends of the Gantry beam, in each case represents one of the two "first linear axes" of the positioning device. Due to the fact that the movable element is mounted on the Gantry beam in such a way that the movable element is linearly movable in the second direction on the Gantry beam, the Gantry beam has a linear guide for guiding the movable element upon a movement in the second direction, which linear guide, in combination with the linear drive, which is connected to the movable element for moving the movable element in the second direction, represents the "second linear axis" of the positioning device.

It can be considered to be essential with respect to the solution of the object, on which the invention is based, that the first air bearing means of the positioning device according to the invention—in addition to the first air bearing arrangement and the second air bearing arrangement—comprises the third air bearing arrangement, and that the guide beam extending in the first direction is arranged on the base next to the third section of the flat guide surface with a flat side surface extending parallel to the first direction and parallel to the third direction.

The third air bearing arrangement thereby in particular has a group of at least three different air bearings, which group comprises: the at least one third horizontal air bearing, the at least one fourth horizontal air bearing, and the at least one lateral air bearing. These at least three different air bearings of the third air bearing arrangement are arranged on the Gantry beam with respect to the second direction (corresponding to the longitudinal direction of the Gantry beam) spatially between the respective (horizontal) air bearings of the first air bearing arrangement and the respective (horizontal) air bearings of the second air bearing arrangement (in a "central section" of the Gantry beam), and thus have the purpose of supporting or of guiding, respectively, the Gantry beam in the region of the "central section" of the Gantry beam between the first end and the second end of the Gantry beam on the flat guide surface of the base (which extends parallel to the first direction and parallel to the second direction) (by means of the at least one third horizontal air bearing and of the at least one fourth horizontal air bearing) as well as to guide it laterally on the one flat side surface of the guide beam (which extends parallel to the first direction and parallel to the third direction) (by means of the at least one lateral air bearing), so that the Gantry beam is linearly movable in the first direction.

In this context, the term "central section of the Gantry beam" identifies a longitudinal section of the Gantry beam extending in the second direction, which, in the second direction, extends over a length, which is maximally 50% of the extension of the Gantry beam in the second direction, and which, with respect to the first end of the Gantry beam and of the second end of the Gantry beam, in each case has a distance in the second direction, which is at least 25% of the extension of the Gantry beam in the second direction.

The air bearings of the third air bearing arrangement have the effect that, during the operation of the positioning device, these air bearings increase the torsional and bending stiffness of the Gantry beam with respect to the first direction and/or the second direction in response to an acceleration of the Gantry beam in the first direction by means of the linear drives of the first linear axis and in response to an acceleration of the movable element in the second direction by means of the linear drive of the second linear axis, and a torsion or bending of the Gantry axis, which can be induced by means of an acceleration of the Gantry beam in the first direction and/or by means of an acceleration of the movable element in the second direction, is thus reduced.

Due to the fact that the at least one third horizontal air bearing and the at least one fourth horizontal air bearing have a distance relative from one another in the first direction, the at least one third horizontal air bearing and the at least one fourth horizontal air bearing are in particular suitable to jointly increase the torsional stiffness of the Gantry beam with respect to a torsion of the Gantry beam about the second direction in response to an acceleration of the Gantry beam in the first direction. The increase of the torsional stiffness of the Gantry beam is thereby determined decisively by the size of the respective stiffness of the at least one third horizontal air bearing and of the at least one fourth horizontal air bearing (in such a way that the increase of the torsional stiffness of the Gantry beam is greater, the greater the respective stiffness of the at least one third horizontal air bearing and of the at least one fourth horizontal air bearing).

Due to the fact that the guide beam extending in the first direction is arranged next to the third section of the flat guide surface, and due to the fact that the central section of the Gantry beam is supported or guided, respectively, on the flat side surface of the guide beam by means of the at least one lateral air bearing and on the third section of the flat guide surface by means of the at least one third horizontal air bearing and of the at least one fourth horizontal air bearing, the at least one lateral air bearing and the at least one third horizontal air bearing and the at least one fourth horizontal air bearing are suitable, due to their arrangement relative to one another, to jointly increase the stiffness of the Gantry beam with respect to a torsion or bending of the Gantry beam about the first direction in response to an acceleration of the movable element in the second direction. The increase of the stiffness of the Gantry beam with respect to a torsion or bending of the Gantry beam about the first direction is thereby determined decisively by the size of the respective stiffness of the at least one lateral air bearing, of the at least one third horizontal air bearing, and of the at least one fourth horizontal air bearing (in such a way that the increase of the stiffness of the Gantry beam with respect to a torsion or bending of the Gantry beam about the first direction is greater, the greater the respective stiffness of the at least one lateral air bearing, of the at least one third horizontal air bearing, or of the at least one fourth horizontal air bearing, respectively).

For the below-mentioned reasons, for example, the third air bearing arrangement is a requirement for the fact that the positioning device according to the invention can have a compact setup (with a relatively small base surface) and is additionally suitable to move the movable element with a relatively large acceleration over a relatively large surface (compared to the base surface of the positioning device).

On the one hand, the guide beam having the flat side surface is arranged on the base next to the third section of the flat guide surface and extends in the first direction in the region of the central section of the Gantry beam through an intermediate space between the Gantry beam and the flat guide surface of the base (in contrast to the positioning device known from the publication CN 113977294 A, in the case of which a lateral guide surface is placed laterally next to the Gantry beam in the vicinity of one of the ends of the Gantry beam at a distance from this one end of the Gantry beam, as explained above). Due to this arrangement of the guide beam, the space requirement of the positioning device according to the invention with respect to the extension of the positioning device in the second direction (corresponding to the longitudinal direction of the Gantry beam) is reduced in an advantageous manner. On the other hand, the arrangement of the guide beam appears to be associated with a disadvantageous effect with respect to a highly dynamic formation of the positioning device according to the invention insofar as, due to the arrangement of the guide beam, the Gantry beam must have a specified distance from the flat guide surface, which is greater than the extension of the flat side surface of the guide beam in the third direction. Due to the arrangement of the guide beam, an "increased" torsional moment in the direction of the second direction can thus act on the Gantry beam in response to an acceleration of the Gantry beam in the first direction (compared to a corresponding torsional moment, which would act on the Gantry beam in response to an identical acceleration of the Gantry beam in the first direction, if the Gantry beam had a distance from the flat guide surface of the base, which is smaller than the extension of the flat side surface of the guide beam in the third direction). In the case of the positioning device according to the invention, however, the above-mentioned disadvantageous effect can be readily accepted because the third air bearing arrangement can be formed in such a way that the torsional stiffness of the Gantry beam with respect to a torsion about the second direction during an acceleration in the first direction is increased by means of the third air bearing arrangement in such a way that the above-mentioned disadvantageous effect, compared to the increase of the torsional stiffness of the Gantry beam due to the third air bearing arrangement, is relatively small.

The increase of the torsional and bending stiffness of the Gantry beam, which can be attained by means of the third air bearing arrangement, with respect to the first direction and/or the second direction in response to an acceleration of the Gantry beam in the first direction and in response to an acceleration of the movable element in the second direction, additionally provides a requirement for the fact that it can be forgone to likewise guide the movable element on the flat guide surface of the base by means of horizontal air bearings (in contrast to the positioning device known from the publication CN 113977294 A). The increase of the torsional and bending stiffness of the Gantry beam, which can be attained by means of the third air bearing arrangement, makes it possible to guide the movable element exclusively on the Gantry beam upon a movement in the second direction, and to nonetheless ensure that the positioning device is formed in a highly dynamic manner, and deformations of the Gantry beam can be kept within tolerable limits even in response to a large acceleration of the movable element in the first direction and/or in the second direction. Due to the fact that the movable element can be arranged on the Gantry beam in such a way that the movable element is guided exclusively on the Gantry beam upon a movement in the second direction, it is possible to guide the movable element on the Gantry beam in such a way that the movable element can be moved in the second direction essentially over the entire length of the Gantry beam. Compared to the positioning device known from the publication CN 113977294 A, the length of the distance, over which the movable element can be moved in the second direction, is increased in this way.

An embodiment of the positioning device is formed in such a way that the third air bearing arrangement comprises two third horizontal air bearings and two fourth horizontal air bearings for guiding the central section of the Gantry beam on the third section of the flat guide surface, wherein the two third horizontal air bearings are arranged relative to one another in such a way that the two third horizontal air bearings have a distance relative to one another in the second direction, and the two fourth horizontal air bearings are arranged relative to one another in such a way that the two fourth horizontal air bearings have a distance relative to one another in the second direction, wherein the two third horizontal air bearings and the two fourth horizontal air bearings are preloaded with respect to the third section of the flat guide surface. Due to the provision of two third horizontal air bearings and two fourth horizontal air bearings in the above-mentioned manner, the third air bearing arrangement provides for an additional increase of the stiffness of the Gantry beam with respect to a torsion or bending of the Gantry beam about the first direction in response to an acceleration of the movable element in the second direction. The distance of the two third air bearings relative to one another in the second direction and the distance of the two fourth horizontal air bearings relative to one another in the second direction can in each case be suitably selected in order to increase the stiffness of the Gantry beam by a specified value.

Another embodiment of the positioning device is formed in such a way that the third air bearing arrangement comprises two lateral air bearings for guiding the Gantry beam on the flat side surface of the guide beam, wherein the two lateral air bearings are arranged relative to one another in such a way that they have a distance relative to one another in the first direction, and wherein the two lateral air bearings are preloaded with respect to the flat side surface of the guide beam. The use of lateral air bearings, which have a distance relative to one another in the first direction, provides for a more stable guidance of the Gantry beam on the flat side surface of the guide beam in response to a movement of the Gantry beam in the first direction, in particular in such a way that a movement of the Gantry beam with respect to a torsion or rotation of the Gantry beam about the third direction is stabilized.

Another embodiment of the positioning device is formed in such a way that the first air bearing arrangement comprises two first horizontal air bearings for guiding the first end of the Gantry beam on the first section of the flat guide surface, wherein the two first horizontal air bearings are arranged relative to one another in such a way that the two first horizontal air bearings have a distance relative to one another in the first direction, wherein the two first horizontal air bearings are preloaded with respect to the first section of the flat guide surface. Due to the fact that the first air bearing arrangement has two first horizontal air bearings (which are arranged at a distance relative to one another in the first direction), the first air bearing arrangement provides for an increase of the stiffness of the first end of the Gantry beam with respect to a rotation or torsion of the Gantry beam about the second direction, so that a movement of the first end of the Gantry beam in the first direction is stabilized with respect to a rotation or torsion of the Gantry beam about the second direction. The increase of the stiffness is thereby a function of the distance between the two first horizontal air bearings in the first direction, so that the stiffness is generally greater, the greater the distance is selected between the two first horizontal air bearings in the first direction.

Another embodiment of the positioning device is formed in such a way that the second air bearing arrangement comprises two second horizontal air bearings for guiding the second end of the Gantry beam on the second section of the flat guide surface, wherein the two second horizontal air bearings are arranged relative to one another in such a way that the two second horizontal air bearings have a distance relative to one another in the first direction, wherein the two second horizontal air bearings are preloaded with respect to the second section of the flat guide surface. Due to the fact that the second air bearing arrangement has two second horizontal air bearings (which are arranged at a distance relative to one another in the first direction), the second air bearing arrangement provides for an increase of the stiffness of the second end of the Gantry beam with respect to a rotation or torsion of the Gantry beam about the second direction, so that a movement of the second end of the Gantry beam in the first direction is stabilized with respect to a rotation or torsion of the Gantry beam about the second direction. The increase of the stiffness is thereby a function of the distance between the two second horizontal air bearings in the first direction, so that the stiffness is generally greater, the greater the distance is selected between the two second horizontal air bearings in the first direction.

Another embodiment of the positioning device is formed in such a way that it has a second air bearing means comprising several air bearings connected to the movable element for guiding the movable element on the Gantry beam. The second air bearing means has the effect that the movable element can be guide exclusively on the Gantry beam without contact and without friction by means of the air bearings of the second air bearing means (without the movable element having to be supported or guided, respectively, on the flat guide surface of the base by means of air bearings). The air bearings of the second air bearing means can thereby be arranged relative to the movable element and relative to the Gantry beam and relative to the respective air bearings of the first air bearing means in such a way that none of the air bearings of the second air bearing means can collide with one of the air bearings of the first air bearing means. For this purpose, all air bearings of the second air bearing means can be placed at a height with respect to the flat guide surface of the base so that the air bearings of the second air bearing means are arranged above the air bearings of the first air bearing means. Under these circumstances, the air bearings of the second air bearing means can be arranged on the movable element with respect to the Gantry beam in such a way that the movable element can be moved—guided by means of the air bearings of the second air bearing means—in the second direction essentially along the entire extension of the Gantry beam in the second direction.

The second air bearing means and the Gantry beam can in particular be formed so that the movable element is linearly movable on the Gantry beam in the second direction— guided on the Gantry beam by means of the air bearings of the second air bearing means. The air bearings of the second air bearing means and the Gantry beam thereby form a linear guide for the movable element in such a way that the movable element is linearly movable in the second direction. This linear guide in combination with the linear drive, which is connected to the movable element to move the movable element in the second direction, represents the "second linear axis" of the positioning device.

A further development of the above-mentioned embodiment of the positioning device is formed in such a way that the Gantry beam has a flat guide surface, which is arranged parallel to the first direction and parallel to the second direction, and that the Gantry beam has a flat side surface, which extends parallel to the second direction and parallel to a third direction, which is directed essentially perpendicular to the flat guide surface of the Gantry beam (the wording "essentially perpendicular" is to suggest that the "third direction" extends along a straight line, which is directed either perpendicular to the flat guide surface of the Gantry beam or which is inclined at an angle of inclination in the range of 0° to 5° with respect to a straight line, which is directed perpendicular to the flat guide surface of the Gantry beam). The second air bearing means thereby comprises at least one first horizontal air bearing and at least one second horizontal air bearing, which at least one first horizontal air bearing and which at least one second horizontal air bearing are arranged on the movable element in such a way that the movable element is guided on the flat guide surface of the Gantry beam by means of the at least one first horizontal air bearing and by means of the at least one second horizontal air bearing of the second air bearing means, wherein the at least one first horizontal air bearing has a distance in the second direction relative to the at least one second horizontal air bearing of the second air bearing means, and the at least one first horizontal air bearing and the at least one second horizontal air bearing of the second air bearing means are preloaded with respect to the flat guide surface of the Gantry beam. The second air bearing means additionally comprises at least one lateral air bearing arranged on the movable element for guiding the movable element on the one flat side surface of the Gantry beam, wherein the at least one lateral air bearing of the second air bearing means is preloaded with respect to the one flat side surface of the Gantry beam.

In the case of this further development of the above-mentioned embodiment, the at least one first horizontal air bearing and the at least one second horizontal air bearing of the second air bearing means are provided in order to support the movable element on the flat guide surface of the Gantry beam upon a movement in the second direction. The at least one lateral air bearing of the second air bearing means is provided to guide the movable element laterally on the one flat side surface of the Gantry beam upon a movement in the second direction, so that the movable element is linearly movable in the second direction.

The respective horizontal air bearings of the second air bearing means and the respective lateral air bearings of the second air bearing means interact with the flat guide surface of the Gantry beam and the flat side surface of the Gantry beam in such a way that the movable element is guided by means of the horizontal air bearings and of the lateral air bearings of the second air bearing means in such a way that the movable element is linearly movable in the second direction. This linear guide of the movable element, in combination with the linear drive, which is connected to the movable element in order to move the movable element in the second direction, represents the "second linear axis" of the positioning device.

Due to the fact that the at least one lateral air bearing of the second air bearing means is preloaded with respect to the one flat side surface of the Gantry beam, the one lateral air bearing is suitable to laterally guide the movable element in a sufficiently stable manner upon a movement in the second direction, namely exclusively on a single guide surface, i.e. on the one flat side surface of the Gantry beam. In order to ensure a sufficiently stable lateral guidance of the movable element upon a movement in the second direction, it is thus not necessary to arrange an additional lateral air bearing on the movable element in such a way that the movable element is laterally guided by means of the additional lateral air bearing on a second side surface of the Gantry beam, which is arranged so as to be located opposite the above-mentioned one flat side surface of the Gantry beam with respect to the first direction. It is ensured in this way that the air bearings of the second air bearing means can be arranged on the Gantry beam with a relatively small space requirement. Due to the fact that the movable element on the Gantry beam is guided laterally exclusively by means of the at least one lateral air bearing on the one flat side surface of the Gantry beam, a second side surface of the Gantry beam located opposite the one flat side surface of the Gantry beam can be designed in such a way that this second side surface is neither covered by the movable element nor by one of the air bearings of the second air bearing means, and can thus be accessed freely in such a way that this second side surface offers space for fastening certain functional elements of the positioning device to this second side surface (for example supply lines for supplying the air bearings with compressed air and/or electrical lines for supplying the linear drives of the two first linear axes and of the linear drive of the second linear axis with electrical energy).

Due to the fact that the at least one first horizontal air bearing and the at least one second horizontal air bearing of the second air bearing means have a distance relative to one another in the second direction, the above-mentioned first horizontal air bearing and the above-mentioned second horizontal air bearing are formed to stabilize the spatial position of the movable element with respect to a rotation or torsion of the movable element about the first direction in response to an accelerated movement of the movable element in the second direction along the Gantry beam. The at least one first horizontal air bearing, the at least one second horizontal air bearing, and the at least one lateral air bearing are furthermore formed to jointly stabilize the spatial position of the movable element with respect to a rotation or torsion of the movable element about the second direction in response to an accelerated movement of the movable element in the first direction.

In a variation of the above-described further development, the positioning device can be formed in such a way that the second air bearing means comprises two first horizontal air bearings arranged on the movable element for guiding the movable element on the flat guide surface of the Gantry beam, wherein the two first horizontal air bearings of the second air bearing means have a distance relative to one another in the first direction and are preloaded with respect to the flat guide surface of the Gantry beam. Alternatively or additionally, the positioning device can be formed in such a way that the second air bearing means comprises two second horizontal air bearings arranged on the movable element for guiding the movable element on the flat guide surface of the Gantry beam, wherein the two second horizontal air bearings of the second air bearing means have a distance relative to one another in the first direction and are preloaded with respect to the flat guide surface of the Gantry beam. Alternatively or additionally, the positioning device can additionally be formed in such a way that the second air bearing means comprises two lateral air bearings arranged on the movable element for guiding the movable element on the one flat side surface of the Gantry beam, wherein the two lateral air bearings of the second air bearing means have a distance relative to one another in the second direction and are preloaded with respect to the flat side surface of the Gantry beam. Due to the fact that the second air bearing means has two first horizontal air bearings arranged on the movable element and/or two second horizontal air bearings arranged on the movable element and/or two lateral air bearings arranged on the movable element in the above-mentioned manner, it is attained that the spatial position of the movable element in response to an accelerated movement of the movable element in the first direction and/or in response to an accelerated movement of the movable element in the second direction can be stabilized particularly effectively, namely with respect to a rotation or torsion of the movable element about the first direction and/or with respect to a rotation or torsion of the movable element about the second direction and/or with respect to a rotation or torsion of the movable element about the third direction.

In order to attain that the respective air bearings of the positioning device are preloaded with respect to a surface, suitable magnetic means, for example, can be provided, for example in such a way that the at least one (or alternatively each) first horizontal air bearing and the at least one (or alternative each) second horizontal air bearing of the second air bearing means are preloaded by means of a magnetic means with respect to the flat guide surface of the Gantry beam, and/or the at least one (or alternative each) lateral air bearing of the second air bearing means is preloaded by means of magnetic means with respect to the one flat side surface of the Gantry beam. For this purpose, the Gantry beam can be made, for example, of a ferromagnetic material (for example steel) and the at least one (or alternatively each) first horizontal air bearing and the at least one (or alternatively each) second horizontal air bearing of the second air bearing means can each be provided with a permanent magnet. Due to a mutual magnetic attraction between the ferromagnetic material of the Gantry beam and a ferromagnet arranged in the respective air bearing, a preloading force of the respective air bearing, which acts on the respective air bearing and which is directed to the Gantry beam, is in each case generated.

In order to preload the air bearings of the first air bearing arrangement, corresponding magnetic means can be provided in such a way that the at least one (or alternatively each) first horizontal air bearing of the first air bearing arrangement is preloaded by means of magnetic means with respect to the first section of the flat guide surface of the base, and/or the at least one (or alternatively each) second horizontal air bearing of the second air bearing arrangement is preloaded by means of magnetic means with respect to the second section of the flat guide surface, and/or the at least one (or alternatively each) third horizontal air bearing of the third air bearing arrangement and the at least one (or alternatively each) fourth horizontal air bearing of the third air bearing arrangement are preloaded by means of magnetic means with respect to the third section of the flat guide surface, and/or the at least one (or alternatively each) lateral air bearing of the third air bearing arrangement is preloaded by means of magnetic means with respect to the one flat side surface of the guide beam. For this purpose, a horizontal (or alternatively each horizontal) air bearing of the first air bearing means can be provided for example, with a permanent magnet, and the base can be made of a ferromagnetic material, or, alternatively, at least certain regions of the base on the flat guide surface can be made of a ferromagnetic material. Analogously, a lateral air bearing of the third air bearing arrangement can be provided, for example, with a permanent magnet, and the guide beam can be made of a ferromagnetic material.

A preloading of the air bearings by means of magnetic means has the advantage that a relatively large preloading force of an air bearing can be generated by means of a relatively small permanent magnet, which reduces the space requirement, which is needed for the arrangement of the respective air bearings, in an advantageous manner, and which thus creates a requirement for a particularly compact, space-saving arrangement of the air bearings.

It goes without saying that alternatively to an air bearing, which is preloaded by means of magnetic means, it is also possible to use vacuum-preloaded air bearings. Vacuum-preloaded air bearings generally have a larger space requirement (compared to an air bearing preloaded by means of magnetic means), in order to ensure the generation of a certain specified preloading force.

Another embodiment of the positioning device is formed in such a way that each third horizontal air bearing of the third air bearing arrangement, each fourth horizontal air bearing of the third air bearing arrangement, and each lateral air bearing of the third air bearing arrangement, are fastened to a common carrier, and the carrier is fastened to the Gantry beam, so that the third air bearing arrangement is held on the Gantry beam by means of the carrier. Due to the fact that all air bearings of the third air bearing arrangement are fastened to a common carrier, the air bearings of the third air bearing arrangement, together with the carrier, form a single assembly, which can be handled as a whole (thus a unit), for example in order to arrange the air bearings of the third air bearing arrangement relative to the Gantry beam or relative to the flat guide surface of the base or relative to the guide beam, or to align them with respect to the first direction, the second direction and/or the third direction. This simplifies a precise spatial arrangement of all air bearings of the third air bearing arrangement. The carrier additionally provides the option of fastening supply lines for supplying the air bearings with operating means required during an operation of the positioning device (e.g. for supplying the respective air bearings with compressed air) to the carrier, so that the air bearings of the third air bearing arrangement, together with the carrier and the respective supply lines, can be provided as a single compact assembly. The carrier can in particular be formed as a housing, which is intended for receiving components of the air bearings of the third air bearing arrangement and/or supply lines for supplying these air bearings with operating means.

A further development of the above-mentioned embodiment of the positioning device is designed in such a way that the carrier is arranged below the Gantry beam in an intermediate space between the Gantry beam and the flat guide surface. A constructive requirement is provided in this way for the fact that during an operation of the positioning device, the Gantry beam is supported on a side facing the flat guide surface in a simple way by means of a single assembly, which comprises the carrier and the air bearings arranged on the carrier and which forms a unit, wherein the above-mentioned assembly as a whole is guided by means of the air bearings on the flat guide surface of the base as well as on the one flat side surface of the guide beam and thus forms a sliding element, which supports and guides the Gantry beam or in particular the central section of the Gantry beam, respectively, without contact and without friction on the flat guide surface of the base, and additionally guides it laterally on the one flat side surface of the guide beam.

Another further development of the above-mentioned embodiment of the positioning device is formed in such a way that the carrier is rotatably mounted on the Gantry beam in such a way that the carrier, together with each third horizontal air bearing of the third air bearing arrangement, each fourth horizontal air bearing of the third air bearing arrangement, and each lateral air bearing of the third air bearing arrangement, can be rotated relative to the Gantry beam about an axis of rotation extending in the third direction. Due to the fact that the carrier can be rotated about an axis of rotation extending in the third direction, it is possible that the spatial position of the third air bearing arrangement as a whole can be changed during an operation of the positioning device relative to the Gantry beam by means of a rotation of the carrier about the axis of rotation. The third air bearing arrangement can always be arranged in a specified stable position with respect to the flat side surface of the guide beam in this way, even if, during an operation of the positioning device, the alignment of the longitudinal direction of the Gantry beam (corresponding to the second direction) should be changed relative to the first direction (for example when the linear motors of the two first linear axes should be controlled in such a way that the first end of the Gantry beam and the second end of the Gantry beam are not each moved synchronously at the same speed in the first direction). In particular collisions of the lateral air bearings of the third air bearing arrangement with the flat side surface of the guide beam can be avoided in this way, and the lateral air bearings of the third air bearing arrangement can thus be protected against an overload or against damage, respectively, due to a collision with the guide beams.

Another further development of the above-mentioned embodiment of the positioning device is formed in such a way that the carrier is connected to the Gantry beam via a rotary joint, which is formed of one or several solid body joints. The use of one or several solid body joints provides for a friction-free and play-free relative movement between the carrier and the Gantry beam and provides a simple option for changing the arrangement of the carrier relative to the Gantry beam in a precisely controllable and reproducible manner.

Another further development of the above-mentioned embodiment of the positioning device comprises a first solid body joint and a second solid body joint. The first solid body joint consists of a first elongate solid body, which extends along a first plane, which is parallel to the third direction, perpendicular to the third direction, and which has a longitudinal axis arranged perpendicular to the third direction, wherein the first elongate solid body has the following longitudinal sections, which are arranged one behind another in the direction of the longitudinal axis of the first elongate solid body:
  a first end section, which forms a first end of the first elongate solid body;
  a second end section, which forms a second end of the first elongate solid body located opposite the first end of the first elongate solid body in the direction of the longitudinal axis of the first elongate solid body;
  a central section arranged between the first end section and the second end section of the first elongate solid body;
  a first web part arranged between the first end section and the central section of the first elongate solid body, the first web part being connected to the first end section and the central section;
  a second web part arranged between the second end section and the central section, the second web part being connected to the second end section and the central section of the first elongate solid body.

The second solid body joint consists of a second elongate solid body, which extends along a second plane, which is parallel to the third direction, perpendicular to the third direction, and which has a longitudinal axis arranged perpendicular to the third direction, wherein the second elongate solid body has the following longitudinal sections, which are arranged one behind another in the direction of the longitudinal axis of the second elongate solid body:
  a first end section, which forms a first end of the second elongate solid body;
  a second end section, which forms a second end of the second elongate solid body located opposite the first end of the second elongate solid body in the direction of the longitudinal axis of the second elongate solid body; a central section arranged between the first end section and the second end section of the second elongate solid body;
  a first web part arranged between the first end section and the central section of the second elongate solid body, the first web part being connected to the first end section and the central section;
  a second web part arranged between the second end section and the central section of the second elongate solid body, the second web part being connected to the second end section and the central section of the first elongate solid body.

The carrier is thereby connected to the Gantry beam via the first solid body joint and the second solid body joint in such a way that the first end section of the first elongate solid body and the second end section of the first elongate solid body are rigidly connected to the carrier, and the central section of the first elongate solid body is rigidly connected to the Gantry beam, and that the first end section of the second elongate solid body and the second end section of the second elongate solid body are rigidly connected to the carrier, and the central section of the second elongate solid body is rigidly connected to the Gantry beam, wherein the first plane and the second plane are inclined relative to one another in such a way that the first plane and the second plane form a common section line, which extends parallel to the third direction. The first web part and the second web part of the first solid body joint, and the first web part and the second web part of the second solid body joint are formed so as to be elastically deformable, so that the central section of the first solid body joint is configured to be moved relative to the first end section of the first solid body joint and to the second end section of the first solid body joint, and the central section of the second solid body joint is configured to be moved relative to the first end section of the second solid body joint and to the second end section of the second solid body joint, wherein the carrier is rotatably mounted about the common section line of the first plane and of the second plane on the Gantry beam by means of the first solid body joint and the second solid body joint.

The arrangement of the first solid body joint and of the second solid body joint, in combination with one another, are to ensure that the carrier (together with all air bearings of the third air bearing arrangement arranged on the carrier) is rotatably arranged on the Gantry beam in such a way that the arrangement of the first solid body joint and of the second solid body joint, in combination with one another, has a smallest possible rotational stiffness with respect to a rotation of the carrier relative to the Gantry beam about the common section line (which extends in the third direction) of the first plane and of the second plane. The latter serves the purpose of avoiding an overload of the lateral air bearings of the third air bearing arrangement or a lift-off of the lateral air bearings of the third air bearing arrangement from the flat side surface of the guide beam in the event that the two linear drives of the two first linear axes should not move the two ends of the Gantry beam synchronously at the same speed in the first direction.

A smallest possible rotational stiffness of the arrangement of the first solid body joint and of the second solid body joint in combination with one another with respect to a rotation of the carrier relative to the Gantry beam about the third direction additionally has the advantage that the carrier and the Gantry beam, together, form a system, which is coupled by means of the first solid body joint and the second solid body joint and which has a small natural frequency (e.g. in the range of less than 30 Hz) with respect to a rotation of the carrier relative to the Gantry beam about the third direction. The latter simplifies a regulation of the two linear drives of the first linear axes.

With respect to the dynamic behavior of the positioning device in response to an accelerated movement of the Gantry beam in the first direction and in response to an accelerated movement of the movable element in the second direction, it would be advantageous, on the other hand, that the carrier and the Gantry beam, together form a system, which is coupled by means of the first solid body joint and the second solid body joint and which in each case has a large stiffness in response to an accelerated movement of the Gantry beam in the first direction and in response to an accelerated movement of the movable element in the second direction with respect to a translation of the carrier relative to the Gantry beam in the first direction and/or in the second direction and/or in the third direction, and with respect to a rotation of the carrier relative to the Gantry beam about the first direction and/or about the second direction. A large stiffness of the coupled system formed from the carrier and the Gantry beam with respect to a translation of the carrier relative to the Gantry beam in the first direction and/or in the second direction and/or in the third direction, and with respect to a rotation of the carrier relative to the Gantry beam about the first direction and/or about the second direction provide for a quicker regulation of the linear drives of the first linear axis and of the linear drive of the second linear axis, improve the vibration behavior of the carrier or of the Gantry beam, respectively, in response to an accelerated movement of the Gantry beam in the first direction and in response to an accelerated movement of the movable element in the second direction, and provides for a higher accuracy of a positioning of the movable element.

The respective stiffnesses of the coupled system formed from the carrier and the Gantry beam are essentially a function of the arrangement of the first solid body joint and of the second solid body joint relative to one another and in particular of the size of the inclination of the first plane with respect to the second plane.

The inclination of the first plane with respect to the second plane (or a corresponding angle of inclination of the first plane with respect to the second plane, respectively), can be suitably selected in such a way that the arrangement of the first solid body joint and of the second solid body joint results in a small rotational stiffness of the coupled system formed from the carrier and the Gantry beam with respect to a rotation of the carrier relative to the Gantry beam about the third direction and also a large stiffness of the coupled system formed from the carrier and the Gantry beam with respect to a translation of the carrier relative to the Gantry beam in the first direction and/or in the second direction and with respect to a rotation of the carrier relative to the Gantry beam about the first direction and/or the second direction. The latter is attained in terms of an acceptable compromise with respect to the above-mentioned requirements, for example, when the first plane is inclined with respect to the second plane about an angle in the range of 30° to 90°, preferably about an angle of approximately 60°.

The first solid body joint and the second solid body joint can in particular be arranged symmetrically with respect to a third plane, which extends parallel to the second direction and parallel to the third direction. This arrangement of the first solid body joint and of the second solid body joint ensures a particularly large stiffness of the coupled system formed from the carrier and the Gantry beam with respect to a translation of the carrier relative to the Gantry beam in the second direction in response to an acceleration of the movable element in the second direction. A symmetrical arrangement of the first solid body joint and of the second solid body joint with respect to the third plane additionally has the effect that the first solid body joint and the second solid body joint are in each case loaded in the same way in response to an acceleration of the movable element in the second direction. This prevents that the first solid body joint and the second solid body joint could enable a rotation of the carrier with respect to the Gantry beam about the third direction in response to an acceleration of the movable element in the second direction and serves the purpose of a stabilization of the spatial position of the carrier with respect to the guide beam during an acceleration of the movable element in the second direction.

Another further development of the above-mentioned embodiment is formed in such a way that the carrier has at least one hollow space, in which the first solid body joint and/or the second solid body joint is arranged. This design of the carrier provides the option of integrating the first solid body joint and/or the second solid body joint into the carrier, so that the first solid body joint and/or the second solid body joint do not protrude or protrude at best only by a relatively small distance in the third direction from the at least one hollow space. The carrier and the Gantry beam can be connected to one another in this way via the first solid body joint and/or the second solid body joint in such a way that the Gantry beam and the carrier, together with the third air bearing arrangement, have a relatively small installation height with respect to the flat guide surface of the base.

In the case of the above-mentioned embodiments, the arrangement of the first solid body joint and of the second solid body joint has the technical effect that the carrier is held in a rest position with respect to the Gantry beam by means of the first solid body joint and of the second solid body joint in such a way that the carrier can be moved out of the rest position by means of a rotation of the carrier relative to the Gantry beam about the common section line of the first plane and of the second plane. The carrier is thereby in the rest position when the first solid body joint and the second solid body joint are each in an undeformed state, so that each of the central sections of these solid body joints is in each case held in a stable position relative to the first end section and to the second end section of the first solid body joint or of the second solid body joint, respectively. If the carrier is moved out of the rest position by means of a rotation of the carrier relative to the Gantry beam, the web parts of the first solid body joint and of the second solid body joint are deformed elastically, so that the first solid body joint and the second solid body joint, together, generate a restoring force acting on the carrier, which counteracts the movement of the Gantry beam out of the rest position.

The positioning device preferably comprises one or several stop elements, which serve as mechanical stops in order to limit a movement of the carrier out of the rest position. For this purpose, the carrier can have, for example, at least one stop element, which is arranged in such a way that the stop element has a distance from the central section of the first solid body joint, when the carrier is arranged in the rest position relative to the Gantry beam, and which stop element can be brought into contact with the central section of the first solid body joint by means of a rotation of the carrier about a specified maximum angle of rotation about the common section line of the first plane and of the second plane, so that the central section of the first solid body joint forms a mechanical stop for the carrier, which limits the rotation of the carrier. Alternatively or additionally, the carrier can have at least one stop element, which is arranged in such a way that the stop element has a distance from the central section of the second solid body joint, when the carrier is arranged in the rest position relative to the Gantry beam, and which stop element can be brought into contact with the central section of the second solid body joint by means of a rotation of the carrier about a specified maximum angle of rotation about the common section line of the first plane and of the second plane, so that the central section of the second solid body joint forms a mechanical stop for the carrier, which limits the rotation of the carrier. A mechanical overload of the first solid body joint and of the second solid body joint can be avoided in this way.

Linear motors, for example, are suitable as linear drives of the positioning device. The positioning device can be formed, for example, in such a way that each linear drive of the two first linear axes is a linear motor and/or the linear drive of the second linear axis is a linear motor. Linear drives of a different type are generally likewise suitable, for example linear drives comprising threaded spindle or ball screw or threaded spindle drive.

BRIEF DESCRIPTION OF THE DRAWINGS

Further details of the invention and in particular exemplary embodiments of the positioning device according to the invention will be described below on the basis of the enclosed drawings, in which.

DETAILED DESCRIPTION OF PREFERRED EMBODIMENTS

Figure 1:
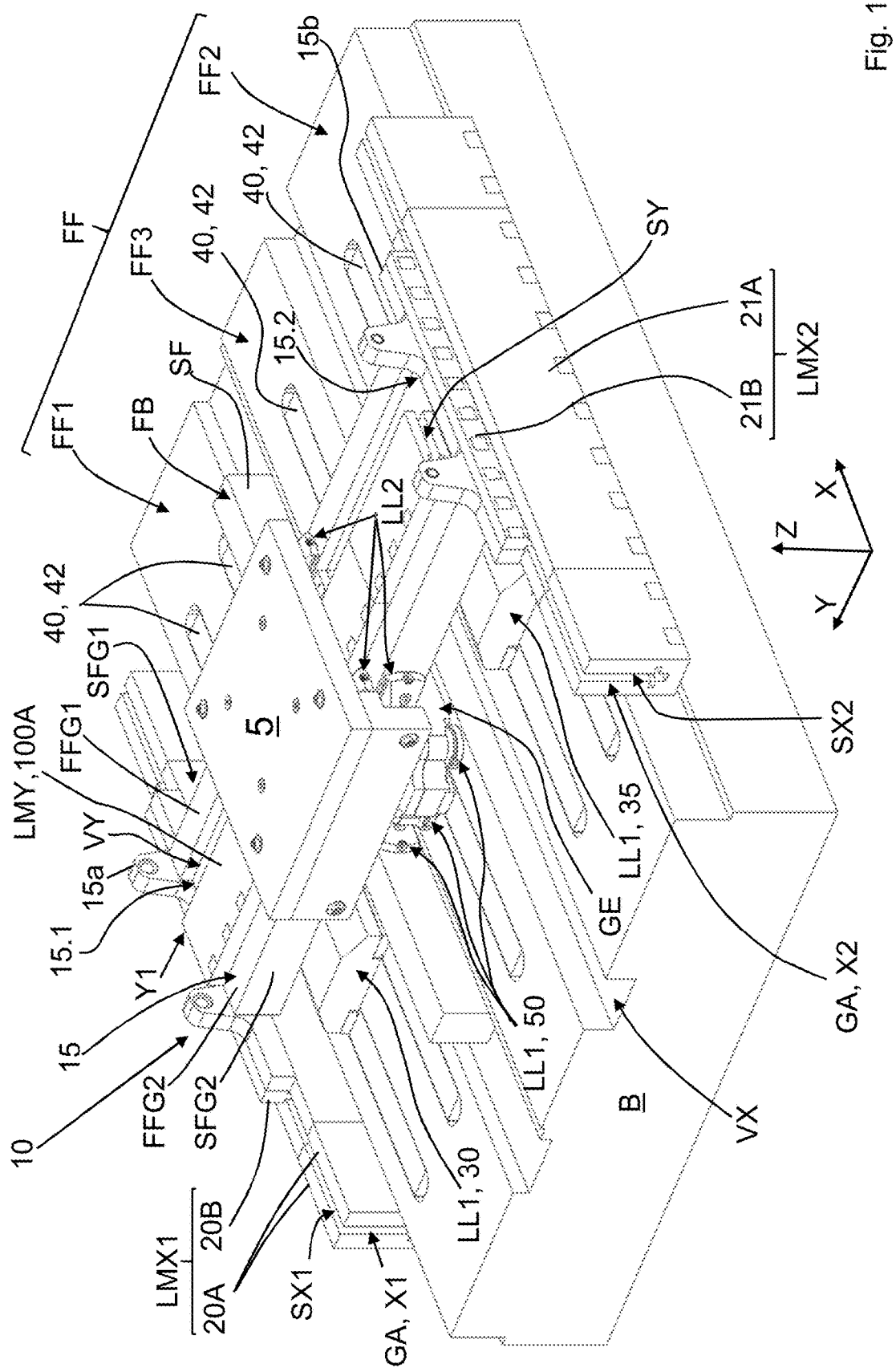
FIG. 1 shows a perspective view of an embodiment of the positioning device according to the invention in an illustration with respect to a coordinate system with three axes X, Y, Z (X-axis, Y-axis, Z-axis), comprising a base comprising a flat guide surface extending parallel to the X-axis and parallel to the Y-axis, comprising a movement means in Gantry design comprising a Gantry beam extending in the direction of the Y-axis and guided on the flat guide surface of the base by means of a first air bearing means comprising several air bearings, and comprising a Gantry drive for moving the Gantry beam in the direction of the X-axis, and comprising a movable element, which is guided on the Gantry beam by means of a second air bearing means comprising several air bearings, and which is linearly movable in the direction of the Y-axis.

Unless otherwise mentioned, the same reference numerals are in each case used for the same elements in the figures.

FIGS. 1-13 show a positioning device 1 according to the invention (or parts of this positioning device 1, respectively) for positioning a movable element 5. In the present example, the movable element 5 is designed as a movable platform or a movable table, respectively, comprising a support surface, onto which, for example, an object can be placed, which is to be positioned by means of the positioning device 1 together with the movable element 5.

Figure 11:
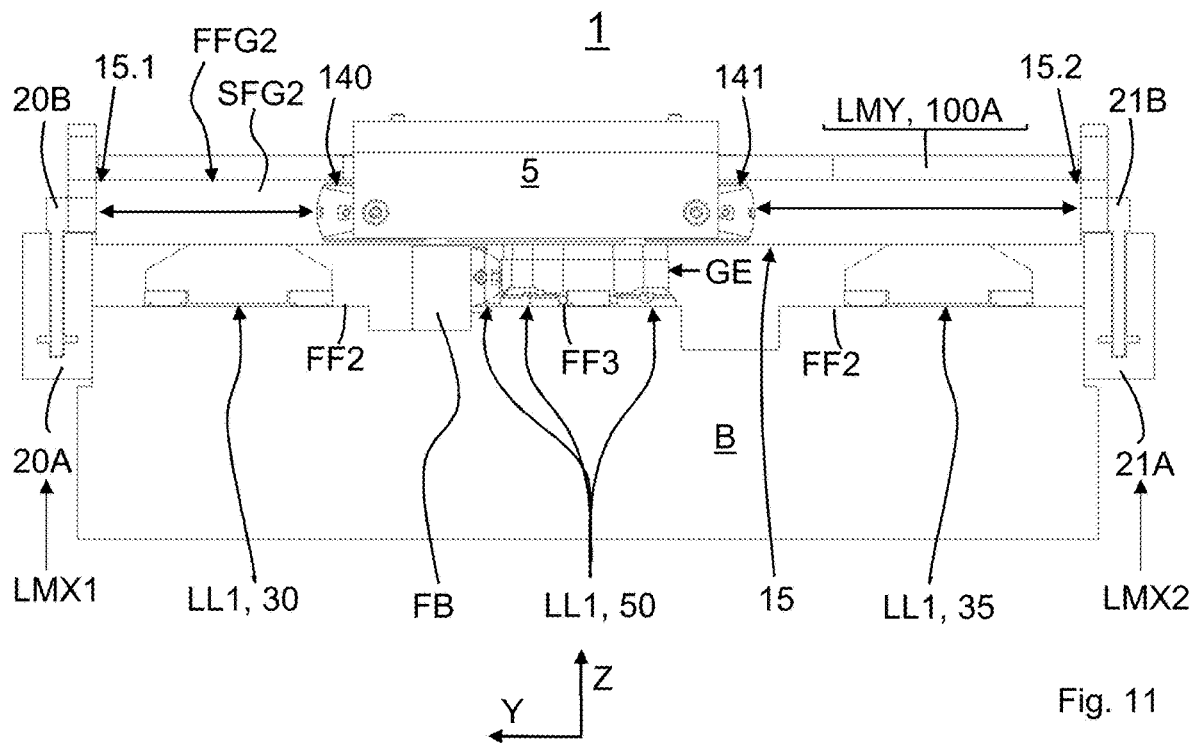
FIG. 11 shows the positioning device according to FIG. 1 in a side view along the X-axis, for illustrating a first side of the positioning device.
Figure 12:
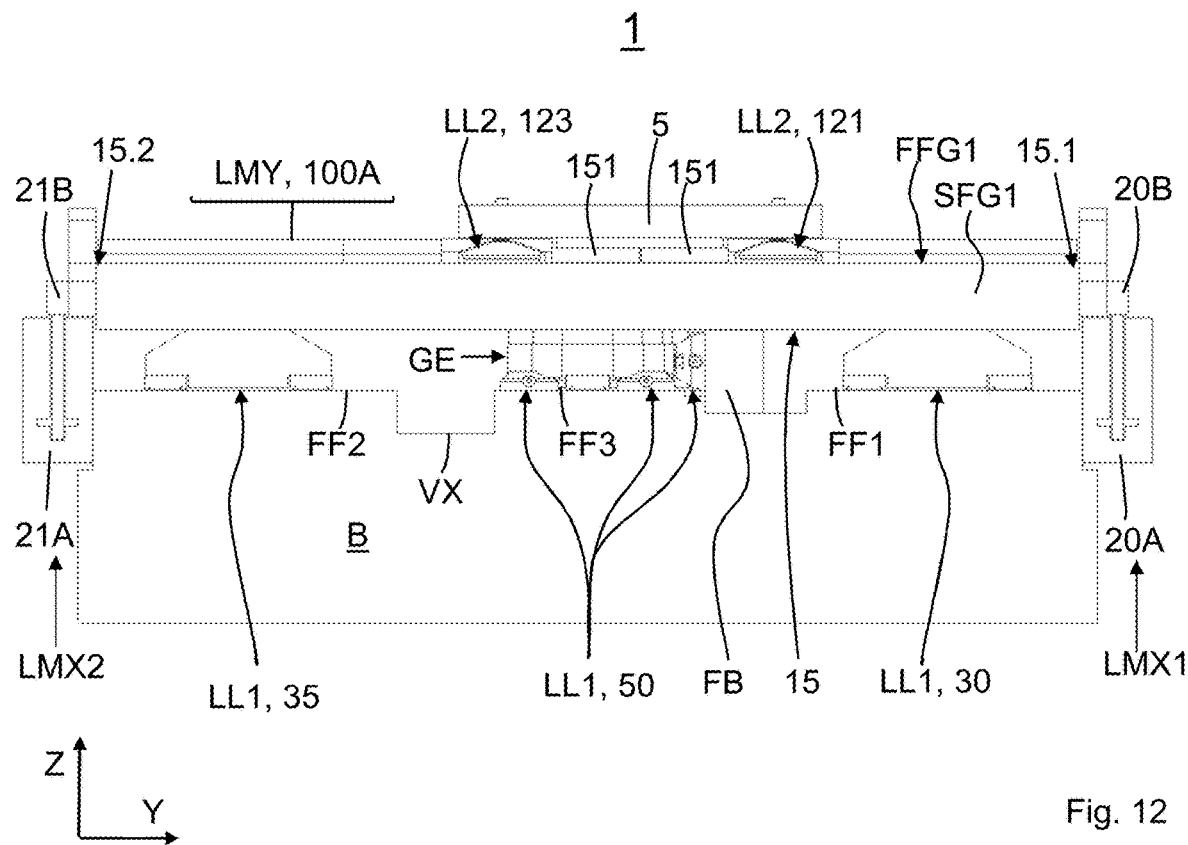
FIG. 12 shows the positioning device according to FIG. 11 in a side view along the X-axis, in an illustration from a perspective other than in FIG. 11, which shows a second side of the positioning device (located opposite the first side of the positioning device with respect to the X-axis)
Figure 13:
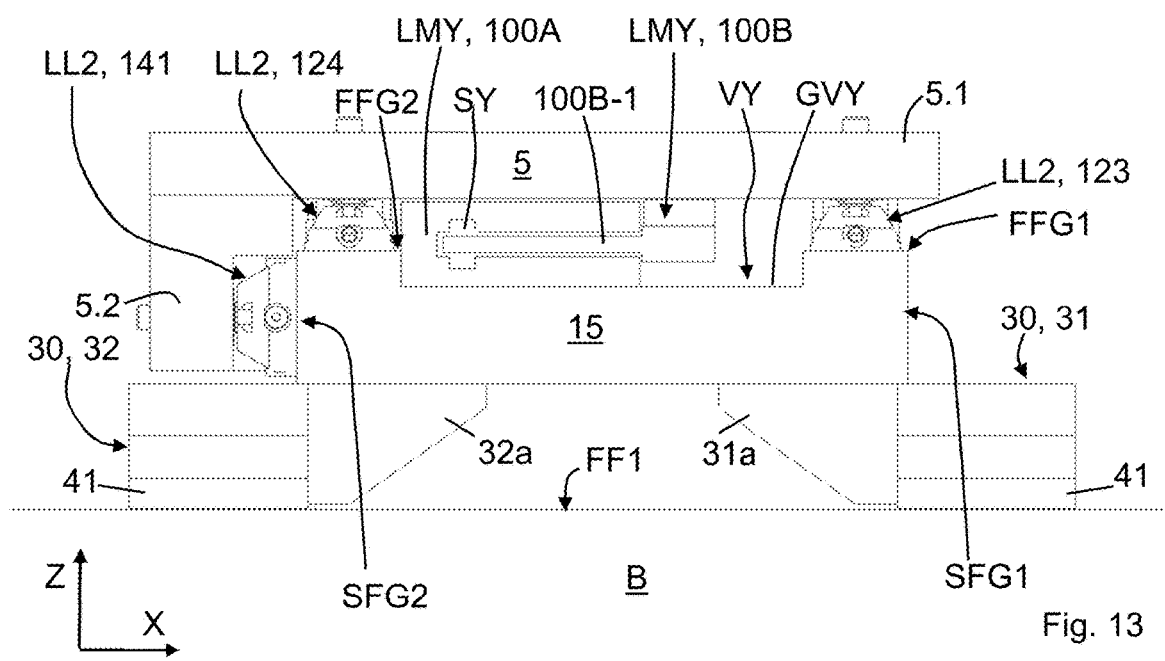
FIG. 13 shows the positioning device according to FIG. 1 in a cross section perpendicular to the Y-axis.

FIG. 1 shows the positioning device 1 in a perspective view with respect to a coordinate system illustrated in FIG. 1 with the three axes X, Y, Z (X-axis, Y-axis, Z-axis), FIGS. 2, 11-13 show the same positioning device 1 in other views from other perspectives, in particular in views along the Z-axis (FIG. 2), the X-axis (FIGS. 11, 12), and the Y-axis (FIG. 13).

As can be seen from FIGS. 1-3 and 11-13, the positioning device 1 comprises a base B, which can be realized, for example, as a plate made of granite and which, in the present example, has, on an upper side, a flat guide surface FF, which is arranged parallel to a first direction (corresponding to the direction of the X-axis according to FIG. 1, hereinafter "first direction X") and parallel to a second direction (corresponding to the direction of the Y-axis according to FIG. 1, hereinafter "second direction Y").

The positioning device 1 is designed to move the movable element 5 parallel to the flat guide surface FF of the base B in the first direction X and/or in the second direction Y, and to thereby position it in specified positions, in each case with an accuracy in the sub-micrometer range (i.e. less than 1 μm). In order to provide for a quick positioning, it is provided to be able to move the movable element 5 with a relatively large acceleration (2 g and more) in the first direction X and/or in the second direction Y.

For this purpose, the positioning device 1 has a first movement means 10 in Gantry design, which first movement means 10 comprises a Gantry beam 15 arranged above the flat guide surface FF and extending in the second direction Y at a distance from the flat guide surface FF, and a Gantry drive GA for moving the Gantry beam 15 relative to the base B in the first direction X. The Gantry beam 15 has a longitudinal axis extending in the second direction Y and, with respect to this longitudinal axis, has a first end 15.1 and a second end 15.2 located opposite the first end 15.1, wherein the Gantry drive GA comprises two first linear axes X1 or X2, respectively, extending in the first direction X, each comprising a linear drive LMX1 or LMX2, respectively. The linear drive LMX1 of the one first linear axis X1 is thereby connected to the first end 15.1 of the Gantry beam 15, so that the first end 15.1 of the Gantry beam 15 can be moved in the first direction X by means of the linear drive LMX1. The linear drive LMX2 of the other first linear axis X2 is therefore connected to the second end 15.2 of the Gantry beam 15, so that the second end 15.2 of the Gantry beam 15 can likewise be moved in the first direction X by means of the linear drive LMX2.

In the present example, the linear drives LMX1 and LMX2 are each formed as conventional linear motors. The linear drive LMX1 (which is formed as linear motor) therefore has a stator 20A, which extends linearly in the first direction X and which is fastened to the base B, and a rotor 20B, which is movable relative to the stator 20A in the first direction X and which is fastened to the first end 15.1 of the Gantry beam 15 via an adapter plate 15*a*. The linear drive LMX2 (which is formed as linear motor) therefore has a stator 21A, which extends linearly in the first direction X and which is fastened to the base B, and a rotor 21B, which is movable relative to the stator 21A in the first direction X and which is fastened to the second end 15.2 of the Gantry beam 15 via an adapter plate 15*b*.

In a cross section perpendicular to the first direction X, the stator 20A of the linear drive LMX1 as well as the stator 21A of the linear drive LMX2 each have an essentially U-shaped profile comprising two legs arranged next to one another, which each limit a gap extending in the first direction X over the entire length of the respective stator 20A or 20B, respectively, i.e. a gap SX1 in the case of the stator 20A and a gap SX2 in the case of the stator 21A. As is common in the case of conventional linear motors, the stator 20A comprises means for providing a static magnetic field in the gap SX1 of the stator 20A, and the stator 21A comprises means for providing a static magnetic field in the gap SX2 of the stator 21A. The rotor 20B of the linear drive LMX1 therefore comprises a coil (not illustrated in the figures), which can be supplied with an electric alternating current for generating a magnetic alternating field, and extends spatially in such a way that a section 20B-1 of the rotor 20B, which comprises the coil of the rotor 20B, protrudes into the gap SX1 of the stator 20A, and the rotor 20B can be moved in the first direction X in this gap SX1 over a distance, which corresponds to the extension of the stator 20A in the first direction X. The rotor 21B of the linear drive LMX2 therefore comprises a coil (not illustrated in the figures), which can be supplied with an electric alternating current for generating a magnetic alternating field, and extends spatially in such a way that a section 21B-1 of the rotor 21B, which comprises the coil of the rotor 21B, protrudes into the gap SX2 of the stator 21A, and the rotor 21B can be moved in the first direction X in this gap SX2 over a distance, which corresponds to the extension of the stator 21A in the first direction X. In order to control a movement of the Gantry beam 15 in the first direction X, the linear drives LMX1 and LMX2 of the two first linear axes X1 or X2, respectively, can be controlled independently of one another by means of a control device (not illustrated in the figures).

In order to attain a space-saving arrangement of the two first linear axes X1 or X2, respectively, the stators of the linear drives LMX1 and LMX2 of the present embodiment of the positioning device 1 according to FIG. 1 are arranged in such a way that the gap SX1 of the stator 20A as well as the gap SX2 of the stator 21A and the rotor 20B as well as the rotor 21B extend essentially parallel to a plane, which is arranged parallel to the first direction X and perpendicular to the flat guide surface FF of the base B, so that the gap SX1 of the stator 20A as well as the gap SX2 of the stator 21A and the rotor 20B as well as the rotor 21B each have an essentially smaller extension in the second direction Y than in the direction perpendicular to the flat guide surface FF. This arrangement of the two first linear axes X1 or X2, respectively, is advantageous with regard to a demand for a smallest possible base surface in a plane, which extends parallel to the first direction X and parallel to the second direction Y, especially since due to the respective structures of the stators 20A and 21A and the structures of the rotors 20B and 21B in the above-mentioned arrangement perpendicular to the flat guide surface FF, each of the two linear drives LMX1 and LMX2 have an extension, which is several times greater (typically by more than a factor of 2) than the extension of the respective linear drive LMX1 or LMX2, respectively, in the second direction Y. The latter can be seen clearly in particular on the basis of the illustrations of the positioning device 1 in FIGS. 1, 2, 11, and 12. The above-mentioned arrangement of the two first linear axes X1 or X2, respectively, thus provides for a structure of the positioning device 1, which has a particularly small spatial extension in the direction of the second direction Y (corresponding to the longitudinal direction of the Gantry beam 15), and which is minimized in particular in view of the arrangement of the two first linear axes X1 or X2, respectively.

Figure 2:
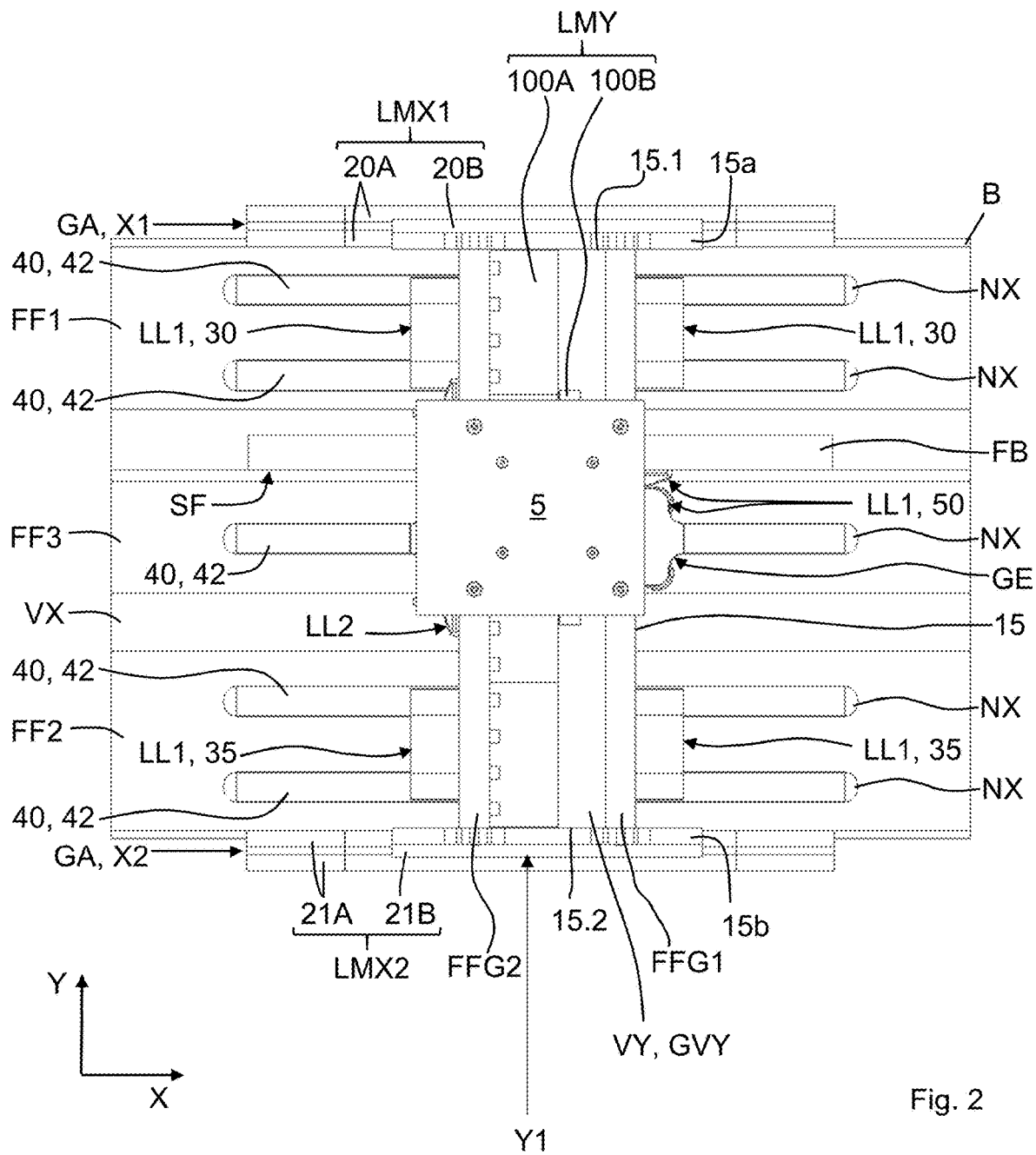
FIG. 2 shows the positioning device according to FIG. 1 in a top view in the direction of the Z-axis.
Figure 3:
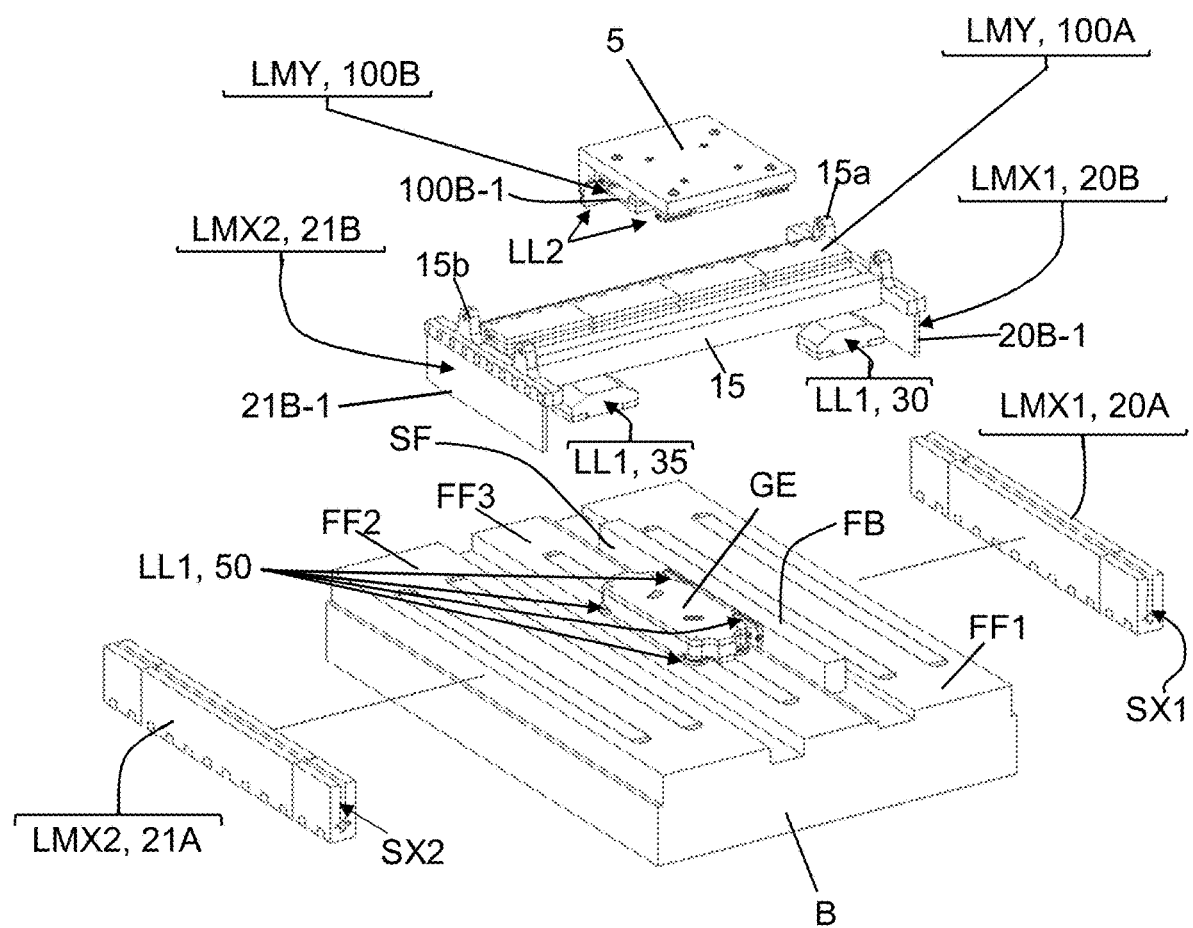
FIG. 3 shows a perspective view of the positioning device according to FIG. 1 in an exploded illustration, which shows in particular a first air bearing arrangement, a second air bearing arrangement, and a third air bearing arrangement of an embodiment of the first air bearing means.

As suggested in FIGS. 1-3, the movable element 5 is mounted on the Gantry beam 15 in such a way that the movable element 5 is linearly movable in the second direction Y on the Gantry beam 15, wherein the Gantry beam 15 has a second linear axis Y1 extending in the second direction Y and comprising a linear drive LMY connected to the movable element 5 for moving the movable element 5 in the second direction Y.

In the present example, the linear drive LMY of the second linear axis Y1 is likewise formed as conventional linear motor and comprises (analogously to the structure of the linear drives LMX1 and LMX2) a stator 100A, which extends linearly in the second direction Y and which is fastened to the upper side of the Gantry beam 15, and which extends in the second direction Y between the first end 15.1 and the second end 15.2 over the entire length of the Gantry beam 15, and a rotor 100B, which can be moved relative to the stator 100A in the second direction Y and which is fastened to the movable element 5.

In a cross section perpendicular to the second direction Y, the stator 100A of the linear drive LMY has an essentially U-shaped profile comprising two legs arranged next to one another, which each limit a gap SY extending in the second direction Y over the entire length of the stator 100A. The stator 100A comprises means for providing a static magnetic field in the gap SY of the stator 100A. The rotor 100B of the linear drive LMY therefore comprises a coil (not illustrated in the figures), which can be supplied with an electric alternating current for generating a magnetic alternating field, and spatially extends in such a way that a section 100B-1 of the rotor 100B comprising the coil of the rotor 100B protrudes into the gap SY of the stator 100A, and the rotor 100B can be moved in the second direction Y in this gap SY over a distance, which corresponds to the extension of the stator 100A in the second direction Y. In order to control a movement of the movable element 5 in the second direction Y, the linear drive LMY can be controlled by means of a control device (not illustrated in the figures).

In order to attain a space-saving arrangement of the second linear axis Y1, the stator 100A of the linear drive LMY of the present embodiment of the positioning device 1 according to FIG. 1 is arranged in such a way that the gap SY of the stator 100A as well as the rotor 100B extend essentially parallel to a plane, which is arranged parallel to the flat guide surface FF of the base B, so that the gap SY of the stator 100A as well as the rotor 100B have a significantly greater extension in the first direction X than in the direction perpendicular to the flat guide surface FF of the base B.

Figure 5:
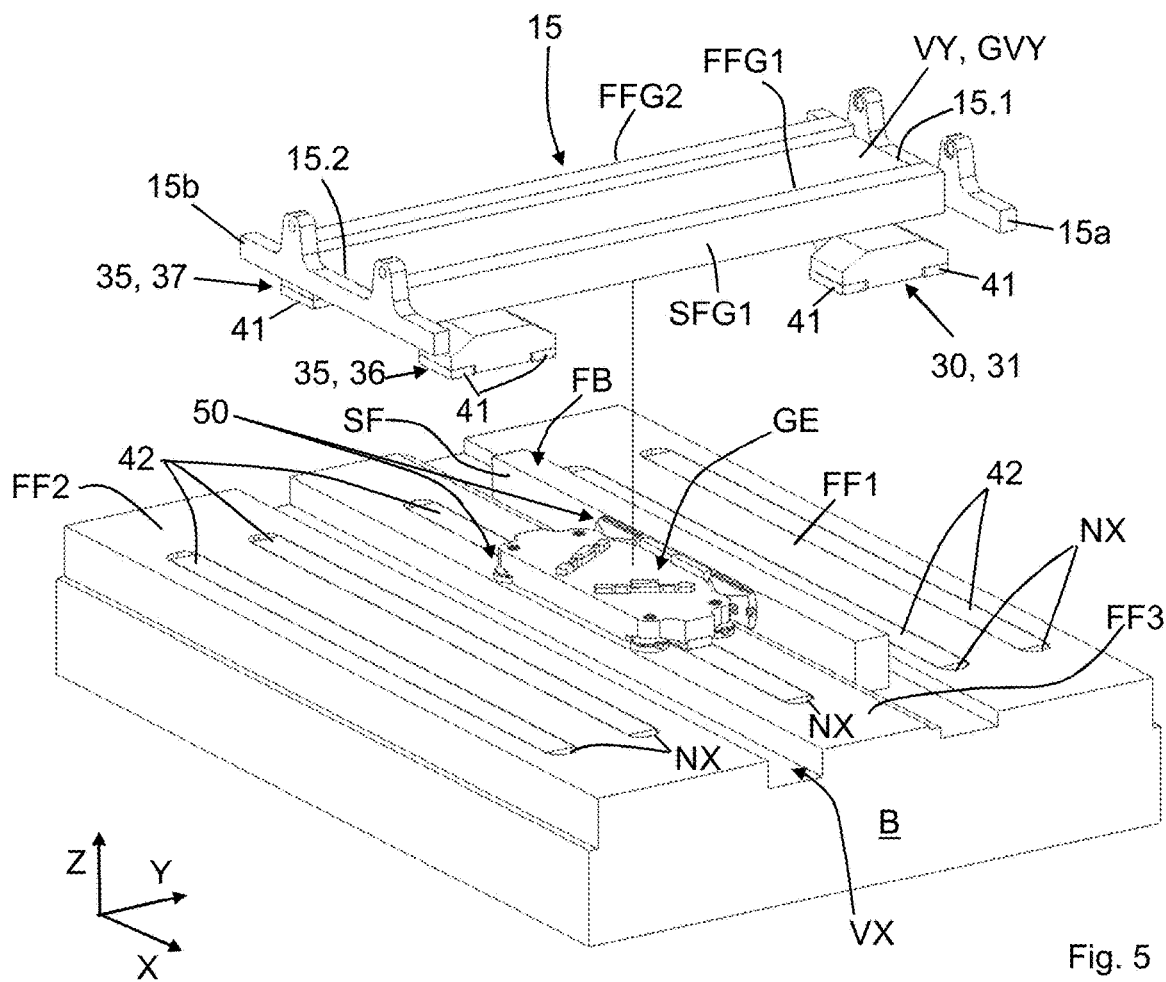
FIG. 5 shows a perspective view of parts of the movement means in Gantry design and of the first air bearing arrangement, of the second air bearing arrangement, and of the third air bearing arrangement of the first air bearing means according to FIG. 3, in an exploded illustration in a view from a perspective other than in FIG. 4.

In order to additionally attain that, together, the Gantry beam 15 and the stator 100A of the linear drive LMY have a smallest possible extension perpendicular to the flat guide surface FF of the base B, the Gantry beam 15 has, on its upper side, a trough-shaped depression VY (which can in particular be seen in FIGS. 1, 5, and 13), which extends in the second direction Y over the entire length of the Gantry beam 15, in the direction of the Z-axis. With respect to a plane perpendicular to the second direction Y, this depression has a rectangular cross sectional area and is limited on a lower side by means of a flat base surface GVY, which extends parallel to the first direction X and parallel to the second direction Y. As can be seen in FIGS. 1, 5, and 13, the stator 100A is placed on the flat base surface GVY of the depression VY, so that the height of the stator 100A with respect to the flat guide surface FF is reduced in this way. The above-mentioned arrangement of the linear axis Y1 therefore provides for a structure of the positioning device 1, which has a particularly small spatial extension in the direction perpendicular to the flat guide surface FF of the base B.

Further details with respect to the support of the movable element 5 on the Gantry beam 15 and details with respect to the arrangement of the rotor 100B on the movable element 5 will be described below, in particular in connection with FIG. 10.

As suggested in FIG. 1, the positioning device 1 has a first air bearing means LL1 comprising several air bearings connected to the Gantry beam 15 for guiding the Gantry beam on the flat guide surface FF of the base B. As can be seen from FIG. 1, the first air bearing means LL1 has a first air bearing arrangement 30, which comprises at least one first horizontal air bearing arranged on the first end 15.1 of the Gantry beam 15 for guiding the first end 15.1 of the Gantry beam 15 on a first section FF1 of the flat guide surface FF extending in the first direction X. The first air bearing means LL1 additionally has a second air bearing arrangement 35, which comprises at least one second horizontal air bearing arranged on the second end 15.2 of the Gantry beam 15 for guiding the second end 15.2 of the Gantry beam 15 on a second section FF2 of the flat guide surface FF extending in the first direction X. The respective air bearings of the first air bearing arrangement 30 and of the second air bearing arrangement 35 have the task of supporting or guiding, respectively, the Gantry beam 15 in each case on a section on the first end 15.1 of the Gantry beam 15 and on a section on the second end 15.2 of the Gantry beam 15 on the flat guide surface FF. Details of the first air bearing arrangement 30 and of the second air bearing arrangement 35 will be described below, in particular in connection with FIGS. 3-5.

As additionally suggested in FIG. 1, the first air bearing means LL1 additionally has a third air bearing arrangement 50, which comprises at least one third horizontal air bearing and at least one fourth horizontal air bearing, wherein the at least one third horizontal air bearing and the at least one fourth horizontal air bearing are arranged on a "central section" of the Gantry beam 15 between the first end 15.1 of the Gantry beam 15 and the second end 15.2 of the Gantry beam 15, so that the "central section" of the Gantry beam 15 is guided on a third section FF3 of the flat guide surface FF, which extends in the first direction X by means of the third horizontal air bearing and of the fourth horizontal air bearing and which, with respect to the second direction Y, is arranged between the first section FF1 of the flat guide surface FF and the second section FF2 of the flat guide surface. Details of the third air bearing arrangement 50 with respect to the above-mentioned at least one third horizontal air bearing and the above-mentioned at least one fourth horizontal air bearing will be described below, in particular in connection with FIGS. 3, 5, and 6.

In this context, "central section" of the Gantry beam 15 is to be considered to be a longitudinal section of the Gantry beam 15 extending in the second direction Y, which, in the second direction Y, extends over a length, which is maximally 50% of the extension of the Gantry beam 15 in the second direction Y, and which, with respect to the first end 15.1 of the Gantry beam 15 and of the second end 15.2 of the Gantry beam 15, in each case has a distance in the second direction Y, which is at least 25% of the extension of the Gantry beam 15 in the second direction Y.

As additionally illustrated in FIG. 1, a guide beam FB, which extends in the first direction X and which has a flat side surface SF, which extends parallel to the first direction X and parallel to a third direction directed essentially perpendicular to the flat guide surface FF (corresponding to the direction of the Z-axis according to FIG. 1, hereinafter "third direction Z"), is arranged on the base B next to the third section FF3 of the flat guide surface FF. The third air bearing arrangement 50 additionally comprises at least one lateral air bearing arranged on the central section of the Gantry beam 15 for guiding the Gantry beam on the one flat side surface SF of the guide beam FB. Details of the third air bearing arrangement 50 with respect to the above-mentioned at least one lateral air bearing will be described below, in particular in connection with FIGS. 3, 5, and 6.

As will be described in more detail below, all air bearings of the third air bearing arrangement 50 in the present example are part of an "assembly", which forms a unit and which is fastened to the Gantry beam 15 and which is arranged below the Gantry beam 15 in an intermediate space between the Gantry beam 15 and the flat guide surface FF and which has the task of supporting or guiding, respectively, the Gantry beam 15 in the region of the central section of the Gantry beam 15 by means of the horizontal air bearings of the third air bearing arrangement 50 in the region of the third section FF3 of the flat guide surface FF, and to guide it laterally on the flat side surface SF of the guide beam FB upon a movement in the first direction X by means of the at least one lateral air bearing of the third air bearing arrangement 50. The above-mentioned assembly therefore forms a "sliding element" GE, which is fastened to the Gantry beam 15 and which is formed to slide without contact on the third section FF3 of the flat guide surface FF and on the flat side surface SF of the guide beam FB in the first direction X during the operation of the positioning device 1, namely on air cushions, which can be created between the sliding element GE and the third section FF3 of the flat guide surface FF by means of the respective horizontal air bearings of the third air bearing arrangement 50, and on air cushions, which can be created between the sliding element GE and the flat side surface SF of the guide beam FB by means of the respective lateral air bearings of the third air bearing arrangement 50. Further structural details of the sliding element GE and of the arrangement thereof on the Gantry beam 15 will be described below, in particular in connection with FIGS. 6, 8, and 9.

As suggested in FIG. 1, the Gantry beam 15 has, on an upper side (facing away from the flat guide surface FF of the base B), two flat guide surfaces FFG1 or FFG2, respectively, which in each case extend on the upper side of the Gantry beam 15 in the second direction Y over the entire length of the Gantry beam 15 between the first end 15.1 and the second end 15.2 of the Gantry beam 15, in each case parallel to the trough-shaped depression VY formed on the upper side of the Gantry beam 15, so that the two flat guide surfaces FFG1 or FFG2, respectively, are arranged on opposite sides of the trough-shaped depression VY with respect to the first direction X. The two flat guide surfaces FFG1 or FFG2, respectively, are thereby each arranged parallel to the first direction X and parallel to the second direction Y.

As additionally suggested in FIG. 1, the Gantry beam 15 additionally in each case has, on two sides located opposite one another with respect to the first direction X, a flat side surface SGF1 or SGF2, respectively, which extends parallel to the second direction Y and essentially perpendicular to the flat guide surface FFG1 or FFG2, respectively, of the Gantry beam 15 over the entire length of the Gantry beam 15 in the second direction Y.

As visible in FIG. 1, the positioning device 1 additionally has a second air bearing means LL2 comprising several air bearings connected to the movable element 5 for guiding the movable element 5 on the Gantry beam 15. The respective air bearings of the second air bearing means LL2 are formed to support and to guide the movable element 5 on the flat guide surfaces FFG1 or FFG2, respectively, of the Gantry beam 15, as well as to guide it on the flat side surface SFG2 of the Gantry beam 15. Further structural details of the second air bearing means LL2 will be described below, in particular in connection with FIG. 10.

It is important to point out that each horizontal air bearing of the first air bearing means LL1 is preloaded with respect to the flat guide surface FF of the base B, and each lateral air bearing of the first air bearing means LL1 is preloaded with respect to the flat side surface SF of the guide beam FB. Each air bearing of the second air bearing means LL2 is therefore preloaded with respect to one of the flat guide surfaces FFG1 or FFG2, respectively, of the Gantry beam 15 or with respect to the flat side surface SFG2 of the Gantry beam 15. In the present example, magnetic means, which will be described below, in particular in connection with FIGS. 4-6 and 10, serve the purpose of preloading the respective air bearings.

Figure 4:
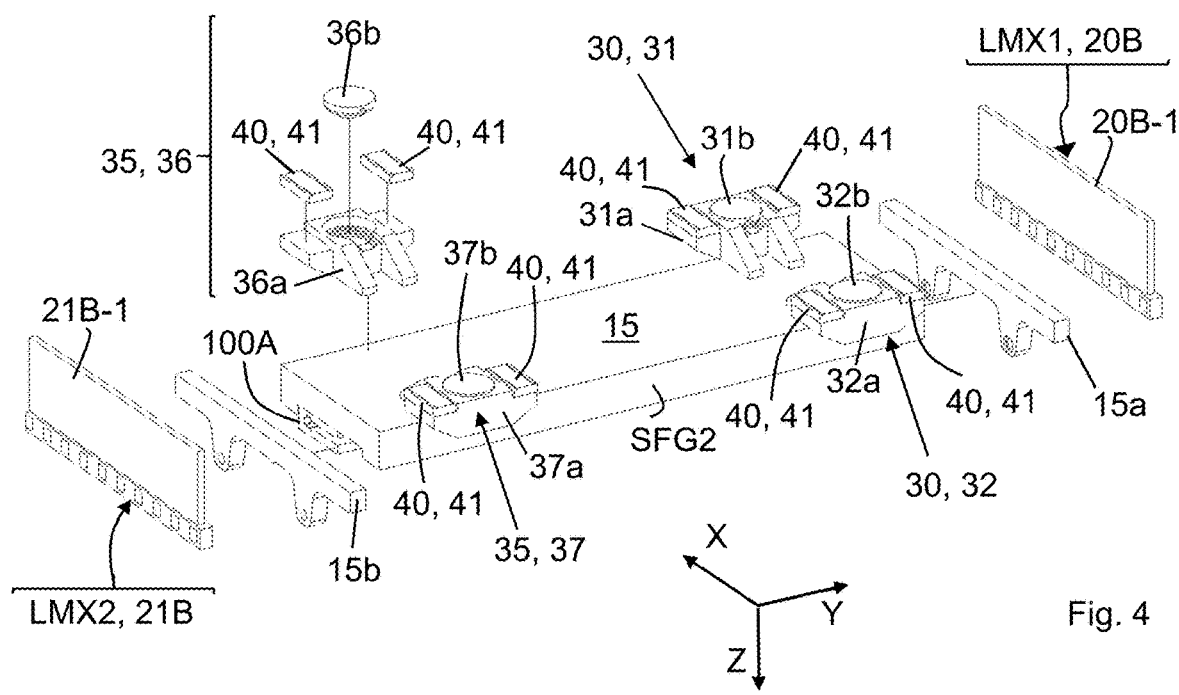
FIG. 4 shows a perspective view of parts of the movement means in Gantry design and of the first air bearing arrangement and of the second air bearing arrangement of the first air bearing means according to FIG. 3, in an exploded illustration.

With regard to FIGS. 3-5, details of the first air bearing arrangement 30 and of the second air bearing arrangement 35 of the first air bearing means LL1 will be described below. In the present example, the first air bearing arrangement 30 of the first air bearing means LL1 comprises two first horizontal air bearings 31 or 32, respectively, for guiding the first end 15.1 of the Gantry beam 15 on the first section FF1 of the flat guide surface FF of the base B. The first horizontal air bearing 31 comprises a bearing carrier 31a, which is fastened to the Gantry beam 15, and a compressed air pad 31b, which is arranged on the bearing carrier 31a and which has a front surface, which is intended for releasing compressed air and which extends essentially parallel to the flat guide surface FF of the base B. The first horizontal air bearing 32 therefore comprises a bearing carrier 32a, which is fastened to the Gantry beam 15, and a compressed air pad 32b, which is arranged on the bearing carrier 32a and which has a front surface, which is intended for releasing compressed air and which extends essentially parallel to the flat guide surface FF of the base B. In the present example, the front surface of the compressed air pad 31b intended for releasing compressed air, and the front surface of the compressed air pad 32b intended for releasing compressed air, have the shape of a circular surface (wherein shapes of these front surfaces deviating from a circular surface would generally also be suitable with regard to the technical function of the two first horizontal air bearings 31 or 32, respectively, which are relevant in this context). The two first horizontal air bearings 31 or 32, respectively, are arranged relative to one another in such a way that the first horizontal air bearing 31 and the first horizontal air bearing 32 have a distance relative to one another in the first direction X, in the present example in such a way that the air bearing pads 31b and 32b are arranged on opposite edges of the Gantry beam 15 with respect to the first direction X (as can be seen from FIG. 4).

Due to the fact that the two first horizontal air bearings 31 or 32, respectively, are arranged at a distance relative to one another in the first direction X, the two first horizontal air bearings 31 or 32, respectively, are suitable to ensure a support of the first end 15.1 of the Gantry beam 15 on the flat guide surface FF during the operation of the positioning device 1, which is relatively stiff with respect to a rotation or torsion of the Gantry beam 15 about the second direction Y, so that a movement of the first end 15.1 of the Gantry beam 15 in the first direction X is stabilized with respect to a rotation or torsion of the Gantry beam about the second direction Y.

It is important to point out that in the context of the present invention, the first air bearing means LL1 does not necessarily have to have two first horizontal air bearings 31 or 32, respectively, for guiding the first end 15.1 of the Gantry beam 15 on the first section FF1 of the flat guide surface FF of the base B. The two first horizontal air bearings 31 or 32, respectively, can also be replaced by a single horizontal air bearing comprising a single compressed air pad, in particular comprising a compressed air pad, the front surface of which, which is intended for releasing compressed air, has a larger extension in the first direction X than in the second direction Y.

Analogously to the structure of the first air bearing arrangement 30, in the present example, the second air bearing arrangement 35 of the first air bearing means LL1 comprises two second horizontal air bearings 36 or 37, respectively, for guiding the second end 15.2 of the Gantry beam 15 on the second section FF2 of the flat guide surface FF of the base B. The second horizontal air bearing 36 comprises a bearing carrier 36a, which is fastened to the Gantry beam 15, and a compressed air pad 36b, which is arranged on the bearing carrier 36a and which has a front surface, which is intended for releasing compressed air and which extends essentially parallel to the flat guide surface FF of the base B. The second horizontal air bearing 37 therefore comprises a bearing carrier 37a, which is fastened to the Gantry beam 15, and a compressed air pad 37b, which is arranged on the bearing carrier 37a and which has a front surface, which front surface is intended for releasing compressed air and extends essentially parallel to the flat guide surface FF of the base B. In the present example, the front surface of the compressed air pad 36b intended for releasing compressed air, and the front surface of the compressed air pad 36b intended for releasing compressed air, have the shape of a circular surface (wherein shapes of these front surfaces deviating from a circular surface would generally also be suitable with regard to the technical function of the two second horizontal air bearings 36 or 37, respectively, which are relevant in this context). The two second horizontal air bearings 36 or 37, respectively, are arranged relative to one another in such a way that the second horizontal air bearing 36 and the second horizontal air bearing 37 have a distance relative to one another in the first direction X, in the present example in such a way that the air bearing pads 36b and 37b are arranged on opposite edges of the Gantry beam 15 with respect to the first direction X (as can be seen from FIG. 4).

Due to the fact that the two second horizontal air bearings 36 or 37, respectively, are arranged at a distance relative to one another in the first direction X, the two second horizontal air bearings 36 or 37, respectively, are suitable to ensure a support of the second end 15.2 of the Gantry beam 15 on the flat guide surface FF during the operation of the positioning device 1, which is relatively stiff with respect to a rotation or torsion of the Gantry beam 15 about the second direction Y, so that a movement of the second end 15.2 of the Gantry beam 15 in the first direction X is stabilized with respect to a rotation or torsion of the Gantry beam about the second direction Y.

It is important to point out that in the context of the present invention, the first air bearing means LL1 does not necessarily have to have two second horizontal air bearings 36 or 37, respectively, for guiding the second end 15.2 of the Gantry beam 15 on the second section FF2 of the flat guide surface FF of the base B. The two second horizontal air bearings 36 or 37, respectively, can also be replaced by a single horizontal air bearing comprising a single compressed air pad, in particular comprising a compressed air pad, the front surface of which, which is intended for releasing compressed air, has a larger extension in the first direction X than in the second direction Y.

With regard to FIGS. 3, 5, and 6, details of the sliding element GE will be described below in connection with the air bearings of the third air bearing arrangement 50. As can be seen in particular from FIG. 6, the sliding element GE comprises a carrier 70 as essential component, which is intended for receiving the air bearings of the third air bearing arrangement 50 and to be fastened to the Gantry beam 15, in order to hold the air bearings of the third air bearing arrangement 50 at specified positions with respect to the Gantry beam 15. In the present example, the carrier 70 is formed as a two-piece housing, comprising a base body 71 having several hollow spaces and a cover plate 72, which is intended for being attached to the base body 71, in order to cover the base body 71 and in particular hollow spaces formed in the base body 71 on a top side of the base body 71 facing away from the flat guide surface FF.

The base body 71 and the cover plate 72 each have the shape of a level flat plate, so that the carrier 70 formed from the base body 71 and the cover plate 72 likewise has the shape of a flat plate. As can be seen from FIGS. 3, 5, 11, and 12, the carrier 70 is mounted on the Gantry beam 15 in such a way that the carrier 70 extends below the Gantry beam 15 in an intermediate space between the Gantry beam 15 and the third section FF3 of the flat guide surface FF parallel to the flat guide surface FF of the base B and parallel to the flat side surface SF of the guide beam FB.

Figure 6:
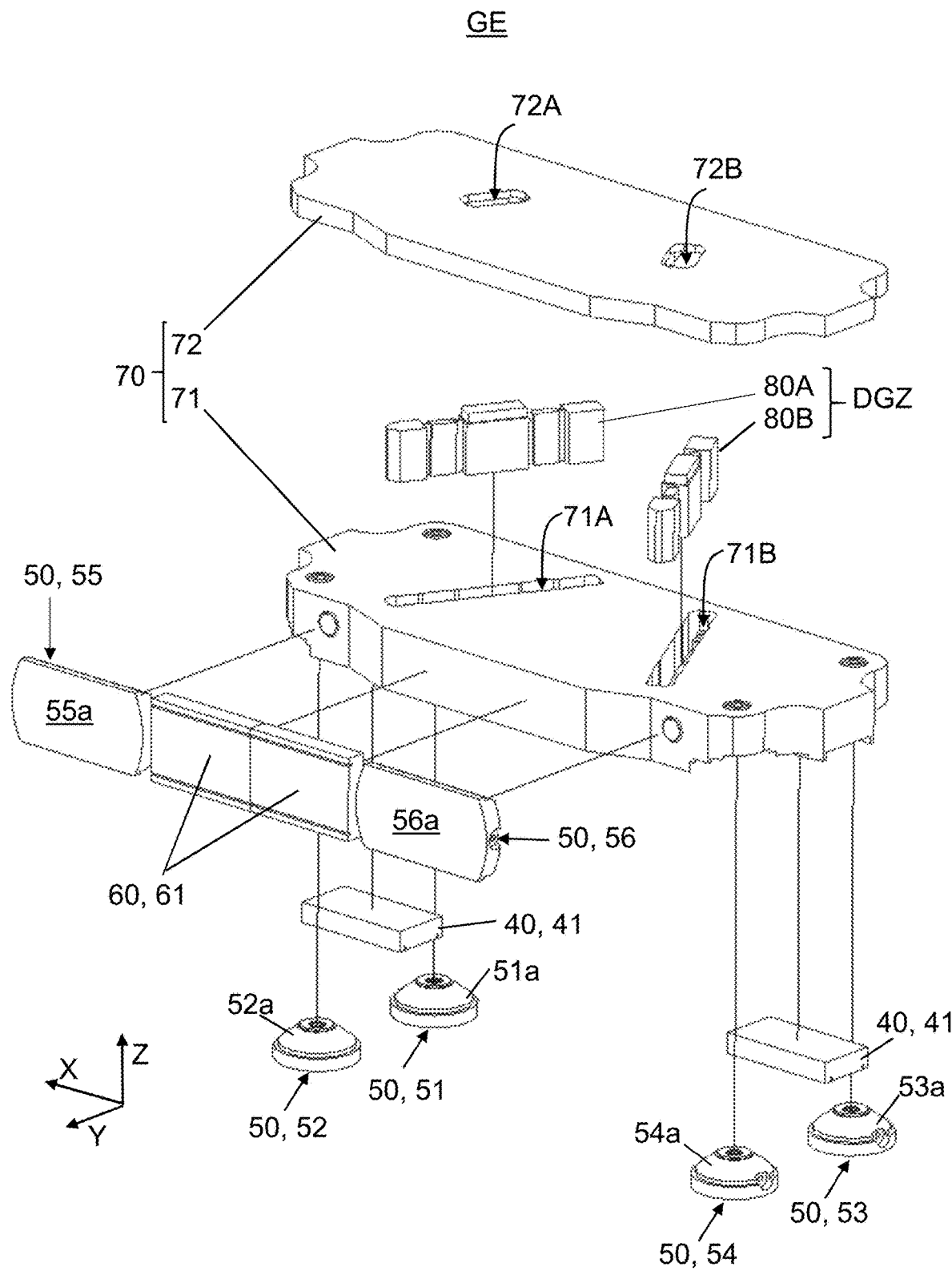
FIG. 6 shows a perspective view of the third air bearing arrangement of the first air bearing means according to FIG. 3, comprising two solid body joints for supporting the third air bearing arrangement on the Gantry beam, in an exploded illustration.

As can be seen from FIG. 6, the third air bearing arrangement 50 in the present example comprises a total of four horizontal air bearings, which are arranged on an underside of the base body 71 of the carrier 70 facing the flat guide surface FF of the base B, namely two third horizontal air bearings 51 or 52, respectively, and two fourth horizontal air bearings 53 or 54, respectively, for guiding the central section of the Gantry beam 15 on the third section FF3 of the flat guide surface FF. The two third horizontal air bearings 51 or 52, respectively, each comprise a compressed air pad 51a or 52a, respectively, wherein the compressed air pads 51a and 52a each have a front surface intended for releasing compressed air, which extends essentially parallel to the flat guide surface FF of the base B. The two fourth horizontal air bearings 53 or 54, respectively, therefore each comprise a compressed air pad 53a or 54a, respectively, wherein the compressed air pads 53a and 54a each have a front surface intended for releasing compressed air, which extends essentially parallel to the flat guide surface FF of the base B.

In the present example, the front surfaces of the compressed air pads 51a, 52a, 53a, or 54a, respectively, which are intended for releasing compressed air, have the shape of a circular surface (wherein shapes of these front surfaces deviating from a circular surface would generally also be suitable with regard to the technical function of the two third horizontal air bearings 51 or 52, respectively, and of the two fourth horizontal air bearings 53 or 54, respectively, which are relevant in this context).

As can be seen from FIG. 6, the two third horizontal air bearings 51 or 52, respectively, are arranged relative to one another in such a way that the two third horizontal air bearings 51 and 52 have a distance relative to one another in the second direction Y, and the two fourth horizontal air bearings 53 and 54 are arranged relative to one another in such a way that the two fourth horizontal air bearings 53 and 54 likewise have a distance relative to one another in the second direction Y. The two third horizontal air bearings 51 and 52, in turn, are arranged relative to the two fourth horizontal air bearings 53 and 54 in such a way that each of the two third horizontal air bearings 51 and 52 each have a distance in the first direction X from each of the two fourth horizontal air bearings 53 and 54.

As can be seen from FIG. 6, the third air bearing arrangement 50 in the present example has two lateral air bearings 55 or 56, respectively, for guiding the Gantry beam 15 on the flat side surface SF of the guide beam FB, wherein the two lateral air bearings 55 and 56 are arranged relative to one another in such a way that they have a distance relative to one another in the first direction X. The lateral air bearing 55 comprises a compressed air pad 55a, and the lateral air bearing 56 comprises a compressed air pad 56a, wherein the two compressed air pads 55a and 56a are each arranged on a side of the base body 71 of the carrier 70 facing the flat side surface SF of the guide beam FB, and each have a certain front surface intended for releasing compressed air, which extends essentially parallel to the flat side surface SF of the guide beam FB. In the present example, the front surfaces of the compressed air pads 55a and 56a intended for releasing compressed air have the shape of an essentially rectangular surface (wherein shapes of these front surfaces deviating from a rectangular surface are generally also suitable with regard to the technical function of the two lateral air bearings 55 or 56, respectively, which are relevant in this context).

As can be seen from FIG. 6, two elongate, essentially cuboidal hollow spaces 71A or 71B, respectively, are formed in the base body 71 of the carrier 70 on a top side of the base body 71 facing the Gantry beam 15, which hollow spaces 71A or 71B each have a longitudinal axis extending perpendicular to the third direction Z or parallel to the flat guide surface FF of the base B, respectively, and, with respect to the first direction X, are arranged in such a way that the elongate hollow space 71A and the elongate hollow space 71B have a distance relative to one another in the first direction X. As suggested in FIG. 6, the elongate hollow spaces 71A and 71B serve the purpose of receiving a first solid body joint 80A or a second solid body joint 80B, respectively, wherein the first solid body joint 80A is intended for being inserted into the hollow space 71A, and the second solid body joint 80B is intended for being inserted into the hollow space 71B, and the two solid body joints 80A or 80B, respectively, are provided to establish a connection between the carrier 70 and the Gantry beam 15 in such a way that the sliding element GE is held via the two solid body joints 80A or 80B, respectively, with respect to the Gantry beam 15 in a stable position on the one hand, and, on the other hand, is mounted on the Gantry beam 15 via the two solid body joints 80A or 80B, respectively, in such a way that the sliding element GE can be rotated relative to the Gantry beam 15 about an axis of rotation extending in the third direction Z, so that the arrangement of the two solid body joints 80A or 80B, respectively, therefore represents a "rotary joint" DGZ, which serves the purpose of connecting the sliding element GE to the Gantry beam 15 and to hold it on the Gantry beam 15 in a movable (rotatable) manner.

As can additionally be seen from FIG. 6, two openings 72A or 72B, respectively, which are continuous in the third direction Z, are formed in the cover plate 72. The spatial arrangement and the shape of the openings 72A and 72B formed in the cover plate 72 are adapted to the spatial arrangement and the shape of the elongate hollow spaces 71A or 71B, respectively, formed in the base body 71 of the carrier 70, namely in such a way that—when the cover plate 72 is arranged on the top side of the base body 71 facing the Gantry beam 15 so that the base body 71 and the cover plate 72 are assembled and together form the carrier 70—the cover plate 72 partially covers the elongate hollow spaces 71A or 71B, respectively, on the top side of the base body 71 facing the Gantry beam 15, and the openings 72A and 72B formed in the cover plate 72 are arranged relative to the elongate hollow spaces 71A and 71B formed in the base body 71 in such a way that the opening 72A is placed directly above the elongate hollow space 71A, and a longitudinal section of the elongate hollow space 71A can be accessed through the opening 72A from the side facing the Gantry beam 15, and that the opening 72B is placed directly above the elongate hollow space 71B, and a longitudinal section of the elongate hollow space 71B can be accessed through the opening 72B from the side facing the Gantry beam 15.

The above-described construction of the carrier 70 provides for an integration of the two solid body joints 80A or 80B, respectively, into the carrier 70. For this purpose, the solid body joint 80A as a whole can be inserted into the hollow space 71A, and one or several sections of the first solid body joint 80A can be fixed to the carrier 70 (i.e. optionally to the base body 71 or to the cover plate 72), while a section of the first solid body joint 80A, which can be accessed through the opening 72a, can be fastened to the Gantry beam 15, in order to establish a connection between the section of the first solid body joint 80A, which can be accessed through the opening 72A, and the Gantry beam 15 through the opening 72A (by means of conventional fastening means, which are suitable for a connection of this type, e.g. by means of screws and/or by means of adhesion). The second solid body joint 80B can analogously be inserted as a whole into the hollow space 71B, and one or several sections of the second solid body joint 80B can be fixed to the carrier 70 (i.e. optionally to the base body 71 or to the cover plate 72), while a section of the second solid body joint 80B, which can be accessed through the opening 72B, can be fastened to the Gantry beam 15, in order to establish a connection between the section of the second solid body joint 80B, which can be accessed through the opening 72B, and the Gantry beam 15 through the opening 72B (by means of conventional fastening means, which are suitable for a connection of this type, e.g. by means of screws and/or by means of adhesion).

Further structural details with respect to the first solid body joint 80A or the second solid body joint 80B, respectively, and an arrangement of these solid body joints 80A and 80B for forming a rotary joint DGZ connecting the sliding element GE to the Gantry beam 15 will be described below, in particular in connection with FIGS. 6-9.

With regard to FIGS. 1, 3, 10-13, details of the structure of the movable element 5 will initially be described in connection with details with respect to the second air bearing means LL2, comprising the air bearings connected to the movable element 5 for guiding the movable element 5 on the Gantry beam 15.

As can be seen from FIGS. 1, 3, 10, and 13, the movable element 5 in the present example is designed as an "L-shaped" platform, which consists of a flat base plate 5.1 and a side wall 5.2 connected to the base plate 5.1. In this context, the term "L-shaped" refers to the shape of a cross sectional area of the movable element 5 (consisting of the base plate 5.1 and the side wall 5.2) with respect to a plane extending perpendicular to the second direction Y in the event that the movable element 5 is placed on the Gantry beam 15 of the positioning device 1—as illustrated in FIGS. 1 and 13.

The movable element 5 is mounted on the Gantry beam 15 in such a way that the base plate 5.1 is arranged above the flat guide surfaces FFG1 and FFG2, which are formed on the top side of the Gantry beam 15, and extends parallel to the first direction X and parallel to the second direction Y in such a way that the base plate 5.1 has an essentially rectangular cross sectional area with respect to a plane extending parallel to the first direction X and parallel to the second direction Y. In the second direction Y, the base plate 5.1 has an extension, which is smaller than the extension of the Gantry beam 15 in the second direction Y, and, in the first direction X, has an extension, which is greater than the extension of the Gantry beam 15 in the first direction X.

As can be seen from FIGS. 1 and 13, the flat guide surfaces FFG1 and FFG2 of the Gantry beam 15 on the one hand, and the side surfaces SFG1 and SFG2 of the Gantry beam 15 on the other hand, are arranged with respect to the "edge regions" of the Gantry beam located opposite the first direction X in such a way that the flat guide surface FFG1 on one of these "edge regions" directly adjoins the side surface SFG1, and the flat guide surface FFG2 on the other one of these "edge regions" directly adjoins the side surface SFG2, in the present example in particular in such a way that the guide surface FFG1 and the side surface SFG1 form two surfaces adjoining one another relative to one another at a right angle, and the guide surface FFG2 and the side surface SFG2 form two surfaces adjoining one another relative to one another at a right angle.

The movable element 5 is thereby arranged in such a way that the base plate 5.1 above the Gantry beam 15 is placed above the flat guide surfaces FFG1 and FFG2 of the Gantry beam 15, and a section of the base plate 5.1 in the region of the flat side surface SFG2 of the Gantry beam 15 protrudes beyond the flat guide surface FFG2 adjoining the flat side surface SFG2 in the first direction X by a distance, which is greater than the extension of the side wall 5.2 in the first direction X. The side wall 5.2 is connected to the base plate 5.1 on the section of the base plate 5.1 protruding beyond the flat guide surface FFG2 in the first direction X in such a way that the side wall 5.2 extends essentially parallel to the flat side surface SFG2 on an underside of the base plate 5.1 in the second direction Y, and thereby has a distance from the flat side surface SFG2.

Figure 10:
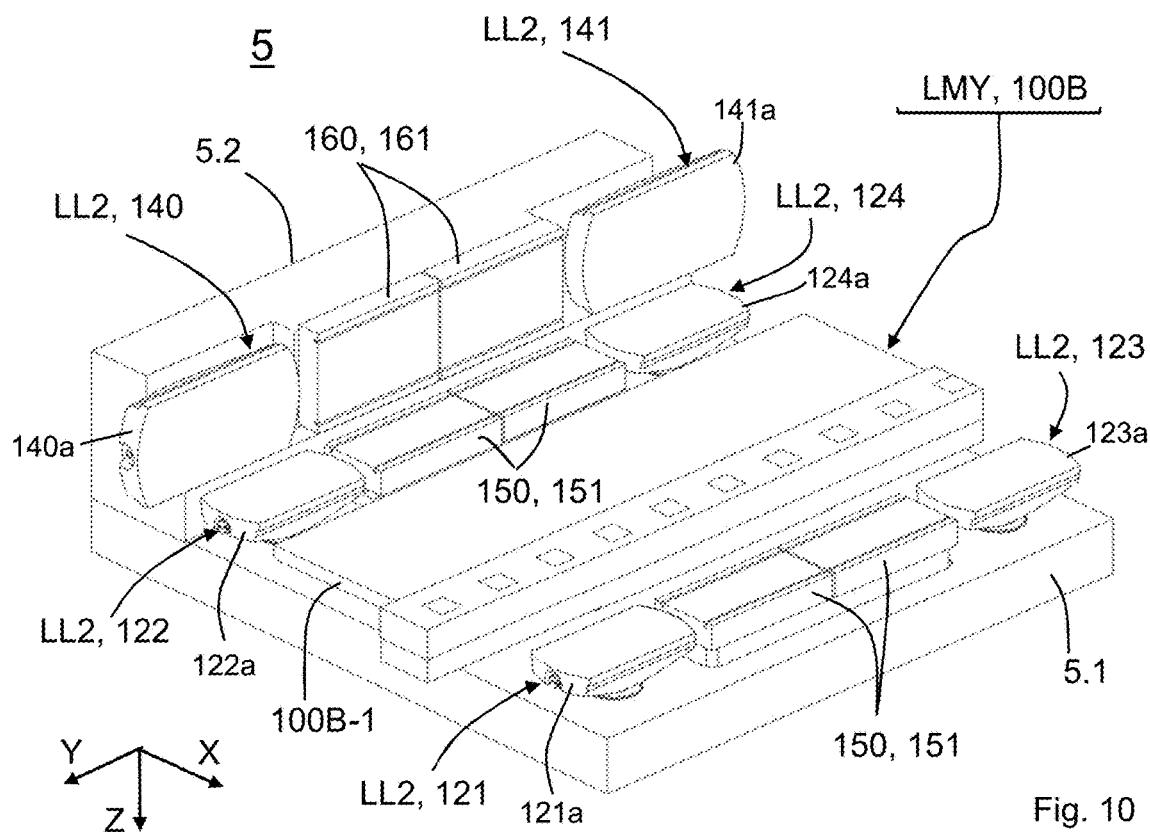
FIG. 10 shows a perspective view of the movable element and of an embodiment of the second air bearing means comprising several air bearings for guiding the movable element on the Gantry beam.

As can be seen from FIGS. 1, 10, and 13, a portion of the air bearings of the second air bearing means LL2 are arranged on the base plate 5.1 of the movable element 5 (in an intermediate space between the base plate 5.1 and one of the flat guide surfaces FFG1 or FFG2, respectively, of the Gantry beam 15), and another portion of the air bearings of the second air bearing means LL2 are arranged on the side wall 5.2 of the movable element 5 (in an intermediate space between the side wall 5.2 and the flat side surface SFG2 of the Gantry beam 15).

The second air bearing means LL2 comprises at least one first horizontal air bearing and at least one second horizontal air bearing, which at least one first horizontal air bearing and which at least one second horizontal air bearing are arranged on the movable element 5 in such a way that the movable element is guided on one of the flat guide surfaces FFG1 or FFG2 of the Gantry beam 15 by means of the at least one first horizontal air bearing and by means of the at least one second horizontal air bearing of the second air bearing means LL2, wherein the at least one first horizontal air bearing and the at least one second horizontal air bearing of the second air bearing means LL2 are preloaded with respect to one of the flat guide surfaces FFG1 or FFG2 of the Gantry beam 15. The second air bearing means LL2 additionally comprises at least one lateral air bearing arranged on the movable element 5 for guiding the movable element 5 on the one flat side surface SFG2 of the Gantry beam 15, wherein the at least one lateral air bearing of the second air bearing means LL2 is preloaded with respect to the one flat side surface SFG2 of the Gantry beam 15.

In the present example (as can also be seen from FIGS. 1 and 13), the second air bearing means LL2 comprises a total of two first horizontal air bearings 121 or 122, respectively, which are arranged on the base plate 5.1 of the movable element 5, for guiding the movable element 5 on the flat guide surface FFG1 or FFG2, respectively, of the Gantry beam 15, wherein the two first horizontal air bearings 121 or 122, respectively, of the second air bearing means LL2 have a distance relative to one another in the first direction X, and are preloaded with respect to the flat guide surface FFG1 or FFG2, respectively, of the Gantry beam 15. According to the present example, the second air bearing means LL2 additionally comprises a total of two second horizontal air bearings 123 or 124, respectively, which are arranged on the base plate 5.1 of the movable element 5, for guiding the movable element 5 on the flat guide surface FFG1 or FFG2, respectively, of the Gantry beam 15, wherein the two second horizontal air bearings 123 or 124, respectively, of the second air bearing means LL2 have a distance relative to one another in the first direction X, and are preloaded with respect to the flat guide surface FFG1 or FFG2, respectively, of the Gantry beam 15. According to the present example, the second air bearing means LL2 furthermore comprises two lateral air bearings 140 or 141, respectively, which are arranged on the side wall 5.2 of the movable element 5, for guiding the movable element 5 on the one flat side surface SFG2 of the Gantry beam 15, wherein the two lateral air bearings 140 or 141, respectively, of the second air bearing means LL2 have a distance relative to one another in the second direction Y, and are preloaded with respect to the flat side surface SFG2 of the Gantry beam 15.

Due to the fact that the two first horizontal air bearings 121 or 122, respectively, of the second air bearing means LL2 have a distance relative to one another in the first direction X, and due to the fact that the two second horizontal air bearings 123 or 124, respectively, of the second air bearing means LL2 likewise have a distance relative to one another in the first direction X, a space, which is available for an arrangement of the rotor 1008 of the linear drive LMY of the second linear axis Y1, is present on the side of the base plate 5.1 facing the Gantry beam 15 between the two first horizontal air bearings 121 or 122, respectively, and between the second horizontal air bearings 123 or 124, respectively. In the present example, the rotor 1008 of the linear drive LMY is therefore arranged on the base plate 5.1 on the side of the base plate 5.1 facing the Gantry beam 15 in such a way that the rotor 1008 extends in the second direction Y through an intermediate space formed between the two first horizontal air bearings 121 or 122, respectively, and through an intermediate space formed between the two second horizontal air bearings 123 or 124, respectively, wherein the two first horizontal air bearings 121 or 122, respectively, are in each case arranged on opposite sides of the rotor 1008 with respect to the first direction X, and the two second horizontal air bearings 123 or 124, respectively, are likewise in each case arranged on opposite sides of the rotor 1008 with respect to the first direction X (FIGS. 10 and 13). The rotor 100B of the linear drive LMY is thereby fastened to the base plate 5.1 in such a way that the section 100B-1 of the rotor 1008 extends parallel to the first direction X and parallel to the second direction Y at a distance from the base plate 5.1, and protrudes into the gap SY of the stator 100A of the linear drive LMY in such a way that the movable element 5, together with the rotor 1008, can be moved in the second direction Y over the entire extension of the Gantry beam 15 between the first end 15.1 and the second end 15.2 (FIGS. 1, 10, and 13).

As can be seen from FIG. 10, the horizontal air bearings 121, 122, 123 or 124, respectively, of the second air bearing means LL2 in each case comprise a compressed air pad 121a, 122a, 123a, or 124a, respectively (in this order), and the two lateral air bearings 140 or 141, respectively, of the second air bearing means LL2 in each case comprise a compressed air pad 140a or 141a, respectively (in this order). The compressed air pad 121a of the one first horizontal air bearing 121 and the compressed air pad 123a of the one second horizontal air bearing 123 are thereby arranged on a side of the base plate 5.1 of the movable element 5 facing the flat guide surface FFG1 of the Gantry beam 15, and each have a front surface, which is intended for releasing compressed air and which extends essentially parallel to the flat guide surface FFG1 of the Gantry beam 15. The compressed air pad 122a of the other first horizontal air bearing 122 and the compressed air pad 124a of the other second horizontal air bearing 124 are therefore arranged on a side of the base plate 5.1 of the movable element 5 facing the flat guide surface FFG2 of the Gantry beam 15, and each have a front surface, which is intended for releasing compressed air and which extends essentially parallel to the flat guide surface FFG2 of the Gantry beam 15. The compressed air pads 140a or 141a, respectively, of the two lateral air bearings 140 or 141, respectively, of the second air bearing means LL2 are therefore arranged on a side of the side wall 5.2 of the movable element 5 facing the flat side surface SFG2 of the Gantry beam 15, and each have a front surface, which is intended for releasing compressed air and which extends essentially parallel to the flat side surface SFG2 of the Gantry beam 15.

As can be seen from FIG. 10, the front surfaces of the compressed air pads 121a, 122a, 123a, or 124a, respectively, of the horizontal air bearings 121, 122, 123, or 124, respectively, of the second air bearing means LL1 intended for releasing compressed air, and the front surfaces of the compressed air pads 140*a* or 141*a*, respectively, of the two lateral air bearings 140 or 141, respectively, of the second air bearing means LL2 intended for releasing compressed air have the shape of an essentially rectangular surface (wherein shapes of these front surfaces deviating from a rectangular surface would generally also be suitable with regard to the technical function of the respective air bearings of the second air bearing means LL2, which are relevant in this context).

It is important to point out that, in the context of the present invention (deviating from the embodiment of the positioning device 1 illustrated in FIGS. 10-13), the second air bearing means LL2 does not necessarily have to have four horizontal air bearings arranged on the movable element 5 (corresponding to the two first horizontal air bearings 121 or 122, respectively, for guiding the movable element 5 on the flat guide surface FFG1 or FFG2, respectively, of the Gantry beam 15, and the two second horizontal air bearings 123 or 124, respectively, for guiding the movable element 5 on the flat guide surface FFG1 or FFG2, respectively, of the Gantry beam 15), and does not necessarily have to have two lateral air bearings (corresponding to the two lateral air bearings 140 or 141, respectively, for guiding the movable element 5 on the one flat side surface SFG2 of the Gantry beam 15).

The two lateral air bearings 140 and 141 can also be replaced by a single lateral air bearing comprising a single compressed air pad, in particular comprising a compressed air pad, the front surface of which, which is intended for releasing compressed air, has a larger extension in the second direction Y than each of the compressed air pads 140*a* and 141*a* illustrated in FIG. 10.

The arrangement of the horizontal air bearings 121 and 123 illustrated in FIG. 10 could additionally be modified in such a way that, instead of the arrangement of the one first horizontal air bearing 121 and of the one second horizontal air bearing 123 for guiding the movable element 5 on the flat guide surface FFG1, a single horizontal air bearing comprising a single compressed air pad is used, in particular comprising a single compressed air pad, the front surface of which, which is intended for releasing compressed air, has a larger extension in the second direction Y than each of the compressed air pads 121*a* and 123*a* illustrated in FIG. 10.

The arrangement of the horizontal air bearings 122 and 124 illustrated in FIG. 10 could analogously be modified in such a way that instead of the arrangement of the first horizontal air bearing 122 and of the second horizontal air bearing 124 for guiding the movable element 5 on the flat guide surface FFG2, a single horizontal air bearing comprising a single compressed air pad is used, in particular comprising a single compressed air pad, the front surface of which, which is intended for releasing compressed air, has a larger extension in the second direction Y than each of the compressed air pads 122*a* and 124*a* illustrated in FIG. 10.

Alternatively, it would also be conceivable to modify the arrangement of the two first horizontal air bearings 121 and 122 illustrated in FIG. 10 in such a way that instead of the arrangement of the two first horizontal air bearings 121 and 122, a single horizontal air bearing comprising a single compressed air pad is used, in particular comprising a single compressed air pad, the front surface of which, which is intended for releasing compressed air, has a greater extension in the first direction X than each of the compressed air pads 121*a* and 122*a* illustrated in FIG. 10. Analogously, it would also be conceivable to alternatively or additional modify the arrangement of the two second horizontal air bearings 123 and 124 illustrated in FIG. 10 in such a way that instead of the arrangement of the two second horizontal air bearings 123 and 124, a single horizontal air bearing comprising a single compressed air pad is used, in particular comprising a single compressed air pad, the front surface of which, which is intended for releasing compressed air, has a greater extension in the first direction X than each of the compressed air pads 123*a* and 124*a* illustrated in FIG. 10.

To realize the above-mentioned alternative, it would be expedient to make additional structural changes with respect to the arrangement of the linear drive LMY and the formation of the flat guide surface FFG1 or FFG2, respectively, of the Gantry beam 15, in order to provide for a guidance of the movable element by means of at least two horizontal air bearings on a flat guide surface in the event that instead of the arrangement of the two first horizontal air bearings 121 and 122, a single horizontal air bearing comprising a single compressed air pad is used and/or instead of the arrangement of the two second horizontal air bearings 123 and 124, a single horizontal air bearing comprising a single compressed air pad is used. It would be expedient, for example, to modify the structure of the Gantry beam 15 in such a way that on the top side of the Gantry beam 15, a flat guide surface is formed, which extends parallel to a first direction X and parallel to the second direction Y, and which extends in the first direction X over the entire width of the Gantry beam 15 (corresponding to the extension of the Gantry beam 15 in the first direction X). In this case, the one horizontal air bearing, which is to be used instead of the arrangement of the two first horizontal air bearings 121 and 122 for guiding the movable element 5 on the one flat guide surface, and/or the one horizontal air bearing, which is to be used instead of the arrangement of the two second horizontal air bearings 123 and 124 for guiding the movable element 5 on the one flat guide surface, is to have an extension in the first direction X, which corresponds approximately to the extension of the Gantry beam 15 in the first direction X.

In the case of a formation of the flat guide surface in the above-mentioned manner, it would be expedient to arrange the linear drive LMY on the Gantry beam 15 in such a way that the stator 100A of the linear drive LMY is not placed on the top side of the Gantry beam 15, but for example on the flat side surface SFG2 of the Gantry beam 15, so that the stator 100A extends over the entire length of the Gantry beam 15 in the second direction Y. The rotor 100B of the linear drive LMY could analogously be arranged on the base plate 5.1 of the movable element 5, so that the section 100B-1 of the rotor 100B protrudes into the gap SY of the stator 100A, which is placed on the flat side surface SFG2, and the rotor 100B can be moved in this gap SY in the second direction Y over a distance, which corresponds to the extension of the stator 100A in the second direction Y.

With regard to FIGS. 1, 2, 4-6, and 10, the already mentioned magnetic means for preloading the air bearings of the first air bearing means LL1 and of the second air bearing means LL2 will be characterized below. In the present example, the positioning device 1 comprises

- a means 40 for preloading the respective horizontal air bearings 31, 32, 36, 37, 51, 52, 53 or 54, respectively, of the first air bearing arrangement 30, of the second air bearing arrangement 35, and of the third air bearing arrangement 50 of the first air bearing means LL1,
- a means 60 for preloading the respective lateral air bearings 55 or 56, respectively, of the third air bearing arrangement 50 of the first air bearing means LL1, a means 150 for preloading the respective horizontal air bearings 121-124 in the second air bearing means LL2, and a means 160 for preloading the respective lateral air bearings 140 or 141, respectively, of the second air bearing means LL2.

On the one hand, the means 40 for preloading the respective horizontal air bearings of the first air bearing arrangement 30 of the first air bearing means LL1 comprises (as can be seen from FIGS. 1, 2, and 4-6) an arrangement of a plurality of permanent magnets 41, which are arranged directly next to the respective compressed air pads 31*b*, 32*b*, 36*b*, or 37*b*, respectively, of the horizontal air bearings 31, 32, 36, or 37, respectively, on the Gantry beam 15 or directly next to the compressed air pads 51*a*, 52*a*, 53*a*, or 54*a*, respectively, of the horizontal air bearings 51, 52, 53, or 54, respectively, on the carrier 70, respectively, and an arrangement of several strips 42, which are in each case made of a ferromagnetic material and which are in each case fastened to the base B and which are in particular integrated into the respective sections FF1, FF2, and FF3 of the flat guide surface FF of the base. As can be seen from FIGS. 1 and 4, two permanent magnets 41 are in each case fastened to each of the bearing carriers 31*a*, 32*a*, 35*a*, and 36*a* of the horizontal air bearings of the first air bearing arrangement 30 and of the second air bearing arrangement 35 in such a way that each of these two permanent magnets 41 in each case extends parallel to the flat guide surface FF, and these two permanent magnets 41 each have a distance relative to one another in the second direction Y, and are each placed (with respect to the second direction Y) directly next to the compressed air pad 31*b*, 32*b*, 35*b*, or 36*b*, respectively, which is arranged on the respective bearing carrier 31*a*, 32*a*, 35*a*, or 36*a*, respectively, on respective opposite sides of the respective compressed air pad 31*b*, 32*b*, 35*b*, or 36*b*, respectively. As can be seen from FIG. 6, two permanent magnets 41 are arranged on the base body 71 of the carrier 70 on the underside thereof facing the flat guide surface FF in such a way that one of these two permanent magnets 41 (with respect to the second direction Y) is arranged in the center between the two third horizontal air bearings 51 or 52, respectively, and the other one of these two permanent magnets 41 (with respect to the second direction Y) in the center between the two fourth horizontal air bearings 53 or 54, respectively. As can be seen from FIGS. 1, 4, and 6, the permanent magnets 41 according to the present example each have the shape of a cuboidal plate and are in each case arranged in such a way that a surface of a respective permanent magnet 41 facing the flat guide surface FF extend parallel to the flat guide surface FF of the base B.

To ensure that all of the horizontal air bearings of the first air bearing means LL1 are preloaded, a total of five of the above-mentioned strips 42, which are made of a ferromagnetic material, are integrated into the respective sections FF1, FF2, and FF3 of the flat guide surface FF of the base in such a way that each of the five strips 42 extends linearly in the first direction X and is thereby placed in such a way that each of the permanent magnets 41 is arranged directly above one of the five strips 42, and has a distance in the third direction Z relative to the respective strip 42. The permanent magnets 41 are thereby magnetized in such a way that a magnetic force of attraction, which is directed perpendicular to the flat guide surface FF in the direction of the flat guide surface FF, acts on each of the permanent magnets 41 due to the magnetic attraction between the respective permanent magnet 41 and the respective strip 42, which is arranged directly under the respective permanent magnet 41.

The respective two permanent magnets 41, which are each arranged on the compressed air pad 31*b* or on the compressed air pad 32*b*, respectively, thus have the effect of preloading the first horizontal air bearing 31 or the first horizontal air bearing 32, respectively, of the first air bearing arrangement 30 with respect to the section FF1 of the flat guide surface FF. The respective two permanent magnets 41, which are each arranged on the compressed air pad 36*b* or on the compressed air pad 37*b*, respectively, thus have the effect of preloading the second horizontal air bearing 36 or the second horizontal air bearing 37, respectively, of the second air bearing arrangement 35 with respect to the section FF2 of the flat guide surface FF. One of the two permanent magnets 41 arranged on the base body 71 of the carrier 70 therefore has the effect of preloading the two third horizontal air bearings 51 or 52, respectively, of the third air bearing arrangement 50 with respect to the section FF3 of the flat guide surface FF, while the other one of the two permanent magnets 41 arranged on the base body 71 of the carrier 70 has the effect of preloading the two fourth horizontal air bearings 53 or 54, respectively, with respect to the section FF3 of the flat guide surface FF.

To provide for a simple integration of the respective strips 42 into the respective sections FF1, FF2, and FF3 of the flat guide surface FF of the base B, a total of five grooves NX, which extend in a straight line in the first direction X, are formed in the sections FF1, FF2, and FF3 of the flat guide surface FF, and a respective one of the strips 42 are arranged in each of the grooves NX in such a way that an upper surface of the respective strip 42 and one of the sections FF1, FF2, and FF3 of the flat guide surface FF are in each case arranged in a flush manner. According to the spatial arrangement of the permanent magnets 41 according to the present example: two strips 42, which extend parallel to one another in the first direction X and which have a distance relative to one another in the second direction Y, are integrated into the first section FF1 of the flat guide surface FF; two strips 42, which extend parallel to one another in the first direction X and which have a distance relative to one another in the second direction Y, are integrated into the second section FF2 of the flat guide surface FF; and a strip 42 is integrated into the third section FF3 of the flat guide surface FF (as can be seen from FIGS. 1, 2, and 5).

On the one hand, the means 60 for preloading the respective lateral air bearings of the third air bearing arrangement 50 of the first air bearing means LL1 comprises (as can be seen from FIGS. 5-6) an arrangement of two permanent magnets 61, which are arranged on a side of the base body 71 of the carrier 70 facing the flat side surface SF of the guide beam FB, and, on the other hand, the guide beam FB, wherein the guide beam FB in the present example is made of a ferromagnetic material. According to the present example, the two permanent magnets 61 each have the shape of a cuboidal plate and are in each case arranged in such a way that a surface of a respective permanent magnet 61 facing the flat side surfaces SF of the guide beam FB in each case extend parallel to the flat side surface SF of the guide beam FB and thereby has a distance from the flat side surface SF of the guide beam FB. The two permanent magnets 61 are in particular arranged, together with the two lateral air bearings 55 or 56, respectively, of the third air bearing arrangement 50, on the base body 71 of the carrier 70 in a row extending in the first direction X, namely in such a way that the two permanent magnets 61 are arranged directly next to one another with respect to the first direction X and are thereby both placed in an intermediate space between the compressed air pad 55a of the lateral air bearing 55 and the compressed air pad 56a of the lateral air bearing 56.

The two permanent magnets 61 are thereby magnetized in such a way that a magnetic force of attraction, which is directed perpendicular to the flat side surface SF of the guide beam FB in the direction of the flat side surface SF, acts on each of the permanent magnets 61 due to the magnetic attraction between the respective permanent magnets 61 and the guide beam FB. The two permanent magnets 61 thus have the effect of preloading the two lateral air bearings 55 or 56, respectively, of the third air bearing arrangement 50 with respect to the flat side surface SF of the guide beam FB.

On the one hand, the means 150 for preloading the respective horizontal air bearings 121-124 of the second air bearing means LL2 comprises (as can be seen from FIG. 10) an arrangement of four permanent magnets 151, which are arranged on the base plate 5.1 of the movable element 5 on a side of the base plate 5.1 of the movable element 5 facing the flat guide surfaces FFG1 or FFG2, respectively, of the Gantry beam 15, and on the other hand, the Gantry beam 15, wherein the Gantry beam 15 is made of a ferromagnetic material in the present example.

According to the present example, the four permanent magnets 151 each have the shape of a cuboidal plate and are in each case arranged in such a way that a surface of a respective permanent magnet 151 facing the flat guide surfaces FFG1 of the Gantry beam 15 or of the flat guide surface FFG2 of the Gantry beam 15, respectively, in each case extends parallel to the flat guide surface FFG1 of the Gantry beam 15 or to the flat guide surface FFG2 of the Gantry beam 15, respectively, and thereby has a distance from the flat guide surface FFG1 of the Gantry beam 15 or from the flat guide surface FFG2 of the Gantry beam 15, respectively.

Two of the permanent magnets 151, together with the first horizontal air bearing 121 and the second horizontal air bearing 123 of the second air bearing means LL2 are in particular arranged in a row extending in the second direction Y, namely in such a way that the two permanent magnets 151 are arranged directly next to one another with respect to the second direction Y and are thereby placed in an intermediate space between the compressed air pad 121a of the first horizontal air bearing 121 and the compressed air pad 123a of the second horizontal air bearing 123 on the base plate 5.1 of the movable element 5 directly above the flat guide surface FFG1 of the Gantry beam 15 at a distance from the flat guide surface FFG1.

The two permanent magnets 151, which are arranged in the intermediate space between the compressed air pad 121a and the compressed air pad 123a, are thereby magnetized in such a way that a magnetic force of attraction, which is directed perpendicular to the flat guide surface FFG1 of the Gantry beam 15 in the direction of the flat guide surface FFG1, acts on each of the permanent magnets 151 due to the magnetic attraction between the respective permanent magnet 151 and the Gantry beam 15. These two permanent magnets 151 thus have the effect of preloading the first horizontal air bearing 121 and the second horizontal air bearing 123 of the second air bearing means LL2 with respect to the flat guide surface FFG1 of the Gantry beam 15.

Two of the permanent magnets 151, together with the first horizontal air bearing 122 and the second horizontal air bearing 124 of the second air bearing means LL2 are additionally arranged in a row extending in the second direction Y, namely in such a way that the two permanent magnets 151 are arranged directly next to one another with respect to the second direction Y and are thereby placed in an intermediate space between the compressed air pad 122a of the first horizontal air bearing 122 and the compressed air pad 124a of the second horizontal air bearing 124 on the base plate 5.1 of the movable element 5 directly above the flat guide surface FFG2 of the Gantry beam 15 at a distance from the flat guide surface FFG2.

The two permanent magnets 151, which are arranged in the intermediate space between the compressed air pad 122a and the compressed air pad 124a, are thereby magnetized in such a way that a magnetic force of attraction, which is directed perpendicular to the flat guide surface FFG2 of the Gantry beam 15 in the direction of the flat guide surface FFG2, acts on each of the permanent magnets 151 due to the magnetic attraction between the respective permanent magnet 151 and the Gantry beam 15. These two permanent magnets 151 thus have the effect of preloading the first horizontal air bearing 122 and the second horizontal air bearing 124 of the second air bearing means LL2 with respect to the flat guide surface FFG2 of the Gantry beam 15.

On the one hand, the means 160 for preloading the respective lateral air bearings 140 or 141, respectively, of the second air bearing means LL2 comprises (as can be seen from FIG. 10) an arrangement of two permanent magnets 161, which are arranged on the side wall 5.2 of the movable element 5 on a side of the side wall 5.2 of the movable element 5 facing the flat side surface SFG2 of the Gantry beam 15, and on the other hand, the Gantry beam 15, wherein the Gantry beam 15 is made of a ferromagnetic material (as already mentioned).

According to the present example, the two permanent magnets 161 each have the shape of a cuboidal plate and are in each case arranged in such a way that a surface of a respective permanent magnet 161 facing the flat side surface SFG2 of the Gantry beam 15 extends parallel to the flat side surface SFG2 of the Gantry beam 15 and thereby has a distance from the flat side surface SFG2 of the Gantry beam 15. Two of the permanent magnets 161, together with the two lateral air bearings 140 or 141, respectively, of the second air bearing means LL2 are additionally arranged in a row extending in the second direction Y, namely in such a way that the two permanent magnets 161 are arranged directly next to one another with respect to the second direction Y and are thereby placed on the side wall 5.2 of the movable element 5 in an intermediate space between the compressed air pad 140a of the lateral air bearing 140 and the compressed air pad 141a of the lateral air bearing 141 directly next to the flat side surface SFG2 of the Gantry beam 15 at a distance from the flat side surface SFG2. The two permanent magnets 161 are thereby magnetized in such a way that a magnetic force of attraction, which is directed perpendicular to the flat side surface SFG2 of the Gantry beam 15 in the direction of the flat side surface SFG2, acts on each of the permanent magnets 161 due to the magnetic attraction between the respective permanent magnet 161 and the Gantry beam 15. The two permanent magnets 161 thus have the effect of preloading the two lateral air bearings 140 or 141, respectively, of the second air bearing means LL2 with respect to the flat side surface SFG2 of the Gantry beam 15.

The arrangement of the permanent magnets 41, 61, 151, and 161 (relative to a strip 42 or relative to the flat side surface SF of the guide beam FB, respectively, or relative to the flat guide surface FFG1 of the Gantry beam 15, respectively, or relative to the flat guide surface FFG2 of the Gantry beam 15, respectively, or relative to the flat side surface SFG2 of the Gantry beam 15, respectively, in this order) can be varied in order to suitably select the size of the respective preloading forces of the individual air bearings of the first air bearing means LL1 and of the individual air bearings of the second air bearing means LL2, as needed (for example as a function of the entire mass of the parts of the positioning device 1, which are to be moved by means of the two linear drives LMX1 and LMX2 of the two first linear axes X1 and X2 during the operation of the positioning device 1).

The preloading forces of the individual air bearings of the first air bearing means LL1 and of the individual air bearings of the second air bearing means LL2 can be selected, for example, so that during the operation of the positioning device 1 (i.e. in response to a corresponding supply of the compressed air pads 31 b, 32b, 36b, 37b, 51a, 52a, 53a, 54a, 55a, and 56a of the air bearings 31, 32, 36, 37, 51, 52, 53, 54, 55, and 56 of the first air bearing means LL1 with compressed air and in response to a corresponding supply of the compressed air pads 121a, 122a, 123a, 124a, 140a, and 141a of the air bearings 121, 122, 123, 124, 140, and 141 of the second air bearing means LL2):

- with respect to the flat guide surface FF of the base B, the individual compressed air pads 31b, 32b, 36b, 37b are each held in a stable position, in which the individual compressed air pads 31b, 32b, 36b, 37b, 51a, 52a, 53a, 54a have a specified distance (e.g. 4 µm) with respect to the flat guide surface FF of the base B;
- with respect to the flat side surface SF of the guide beam FB, the individual compressed air pads 55a and 56a are each held in a stable position, in which the individual compressed air pads 55a and 56a have a specified distance (e.g. 4 µm) with respect to the flat side surface SF of the guide beam FB;
- with respect to the Gantry beam 15, the individual compressed air pads 121a, 122a, 123a, 124a are held in a stable position, in which the compressed air pads 121a and 123a with respect to the flat guide surface FFG1, and the compressed air pads 122a and 124a with respect to the flat guide surface FFG2 in each case have a specified distance (e.g. 4 µm); and
- with respect to the Gantry beam 15, the individual compressed air pads 140a and 141a are held in a stable position, in which the compressed air pads have a specified distance (e.g. 4 µm) with respect to the flat side surface SFG2.

With regard to FIGS. 5, 6, 7A, 7B, 8, and 9, structural details with respect to the first solid body joint 80A or of the second solid body joint 80B, respectively, and an arrangement of these solid body joints 80A and 80B for forming a rotary joint DGZ connecting the sliding element GE to the Gantry beam 15, will be described.

As already mentioned, the first solid body joint 80A and the second solid body joint 80B are arranged on the carrier 70 of the sliding element GE spatially differently, in order to establish a connection between the carrier 70 and the Gantry beam 15, so that the sliding element GE can be rotated about an axis of rotation, which extends in the third direction Z, relative to the Gantry beam 15. However, as suggested in FIGS. 7A and 7B, the first solid body joint 80A and the second solid body joint 80B can be formed to be identical with respect to their physical structure in the present example.

Figure 7A:
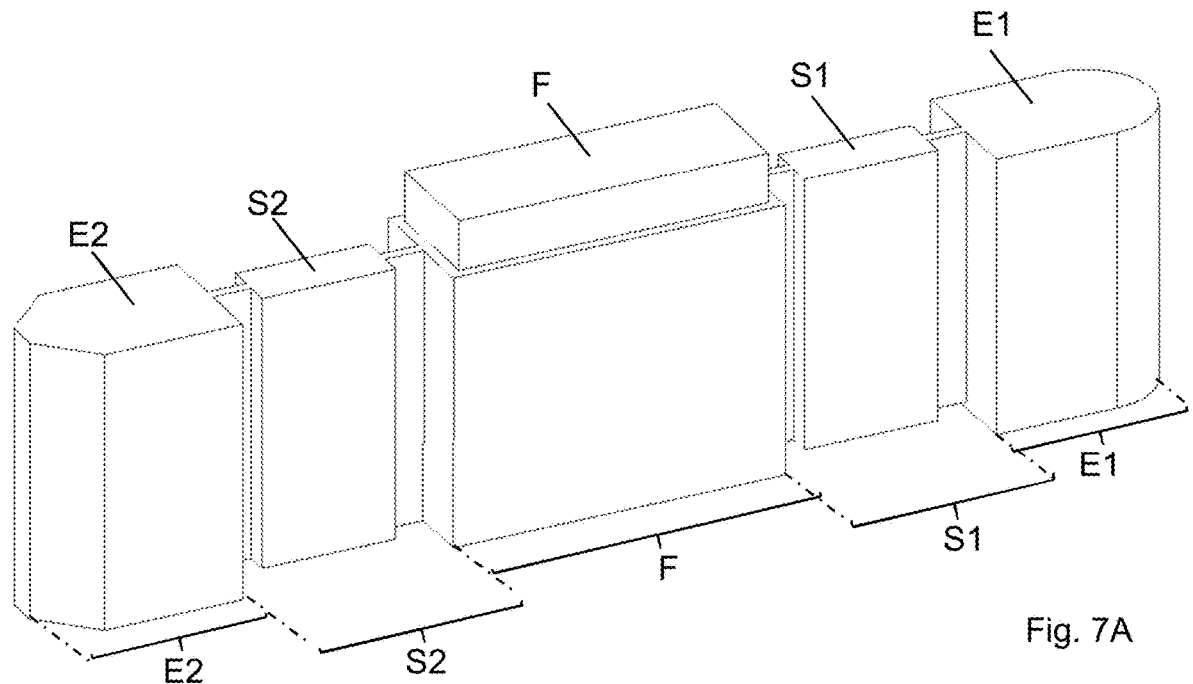
FIG. 7A shows a perspective view of one of the two solid body joints according to FIG. 6.
Figure 7B:
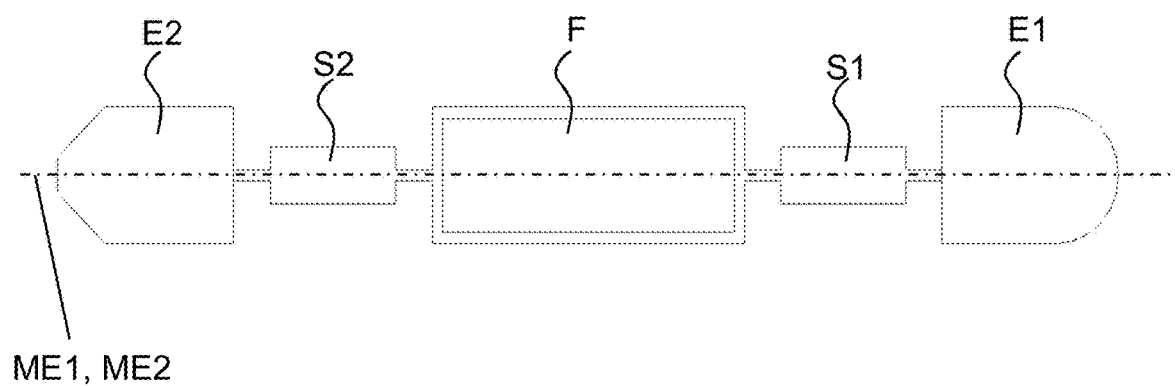
FIG. 7B shows the solid body joint according to FIG. 7A, in a top view in the direction of the Z-axis.

FIGS. 7A and 7B show the first solid body joint 80A or the second solid body joint 80B, respectively, from different perspectives, i.e. in a perspective view (FIG. 7A) and in a top view along the third direction Z.

As suggested in FIGS. 7A, 7B, 8, and 9, the first solid body joint 80A as well as the second solid body joint 80B each consists of an elongate solid body (e.g. made of steel), which extends along a plane, which is parallel to the third direction Z, perpendicular to the third direction Z, and which has a longitudinal axis arranged perpendicular to the third direction Z.

Figure 9:
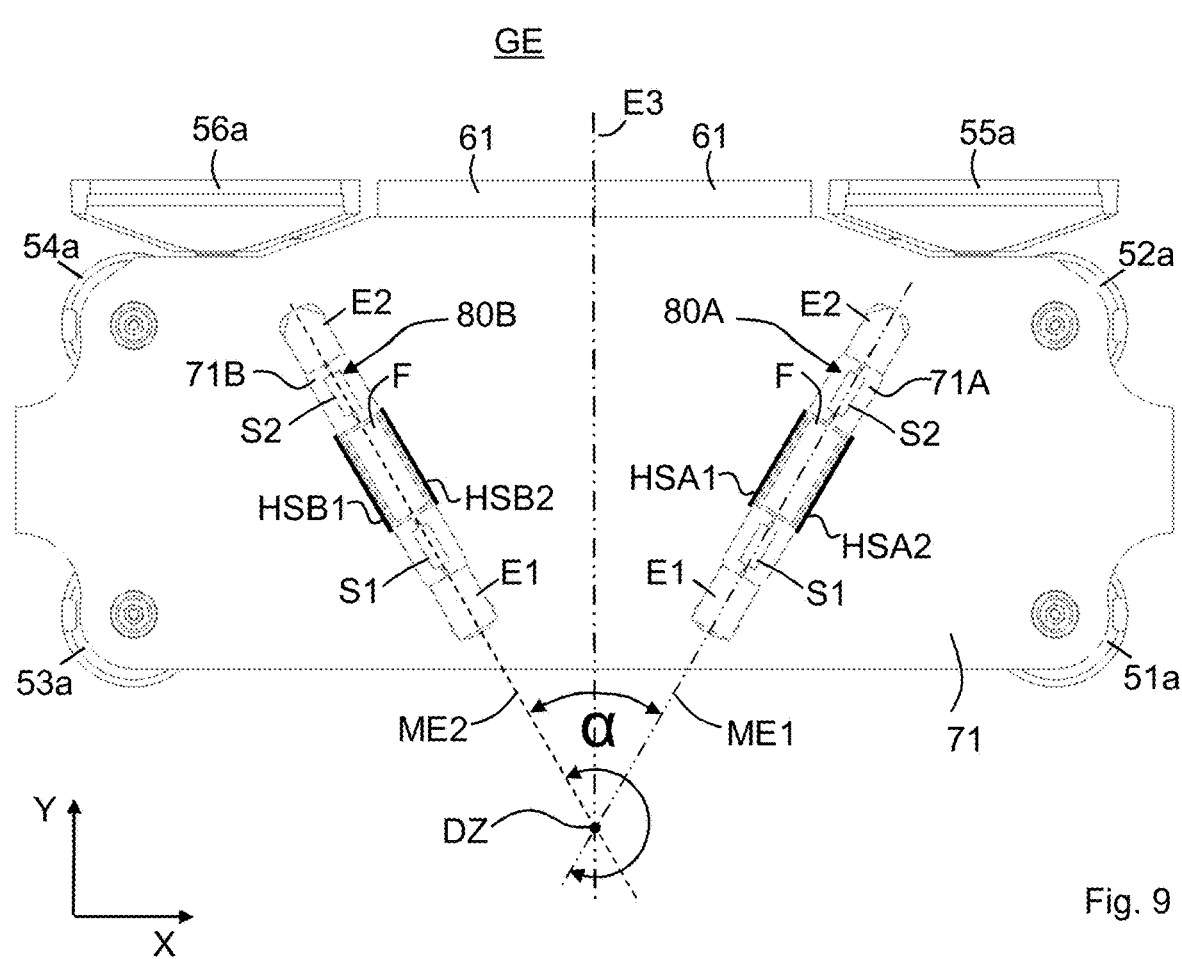
FIG. 9 shows the third air bearing arrangement of the first air bearing means according to FIG. 8, in a top view in the direction of the Z-axis.

As suggested in FIGS. 7A and 9, it is assumed in this context that a first elongate solid body forming the first solid body joint 80A extends along a first plane ME1, which is parallel to the third direction Z, and that a second elongate solid body forming the second solid body joint 80B extends along a second plane ME2, which is parallel to the third direction Z.

FIGS. 7A and 7B each represent the first solid body joint 80A or the second solid body joint 80B, respectively, in an "undeformed base state", in which the respective elongate solid body of the first solid body joint 80A or of the second solid body joint 80B, respectively, is not subject to a mechanical stress and is therefore "undeformed". In the undeformed base state, the first elongate solid body of the first solid body joint 80A is symmetrical to the first plane ME1, and the second elongate solid body of the second solid body joint 80B is formed symmetrically to the second plane ME2.

As can be seen from FIGS. 7A and 7B, the first elongate solid body of the first solid body joint 80A, in the direction of its longitudinal axis extending along the first plane ME1, and second elongate solid body of the second solid body joint 80B, in the direction of its longitudinal axis extending along the second plane ME2, each have the following longitudinal sections, which are arranged one behind the other:

- a first end section E1, which forms a first end of the respective (first or second, respectively) elongate solid body;
- a second end section E2, which forms a second end of the respective (first or second, respectively) elongate solid body, which is located opposite the first end of the respective (first or second, respectively) elongate solid body in the direction of the longitudinal axis of the respective (first or second, respectively) elongate solid body;
- a central section F arranged between the first end section E1 and the second end section E2 of the respective (first or second, respectively) elongate solid body;
- a first web part S1, which is arranged between the first end section E1 and the central section F of the respective (first or second, respectively) elongate solid body, connected to the first end section E1 and the central section F;
- a second web part S2, which is arranged between the second end section E2 and the central section F, connected to the second end section E2 and the central section F of the respective (first or second, respectively) elongate solid body.

As suggested in FIGS. 7A and 7B, the first elongate solid body of the first solid body joint 80A and the second elongate solid body of the second solid body joint 80B are each formed in such a way that the first web part S1 and the second web part S2 of the first solid body joint 80A, in a direction perpendicular to the first plane ME1, each has a smaller extension than the first end section E1, the second end section E2, and the central section F of the first solid body joint 80A, and that the first web part S1 and the second web part S2 of the second solid body joint 80B, in a direction perpendicular to the second plane ME2, each has a smaller extension than the first end section E1, the second end section E2, and the central section F of the second solid body joint 80B. The above-mentioned formation of the web parts S1 and S2 has the effect that the first elongate solid body of the first solid body joint 80A as well as the second elongate solid body of the second solid body joint 80B are elastically deformable mainly in the region of the web parts S1 and S2.

The carrier 70 is connected to the Gantry beam 15 via the first solid body joint 80A and the second solid body joint 80B in such a way that the first end section E1 of the first solid body joint 80A and the second end section E2 of the first solid body joint 80A are rigidly connected to the carrier 70, and the central section F of the first solid body joint 80A is rigidly connected to the Gantry beam 15, and that the first end section E1 of the second solid body joint 80B and the second end section E2 of the second solid body joint 80B is rigidly connected to the carrier 70, and the central section F of the second solid body joint 80B is rigidly connected to the Gantry beam 15.

To realize the above-mentioned arrangement of the first solid body joint 80A and of the second solid body joint 80B (as suggested in FIGS. 6-9), the first solid body joint 80A is arranged in the elongate hollow space 71A formed in the base body 71 of the carrier 70, so that the first end section E1 and the second end section E2 of the first solid body joint 80A are rigidly connected to the carrier 70 (e.g. by means of a connection by means of a screw), and the central section F of the first solid body joint 80A is rigidly connected to the Gantry beam 15 through the opening 72A formed in the cover plate 72 of the carrier 70 (e.g. by means of a connection by means of a screw). The second solid body joint 80B is therefore arranged in the elongate hollow space 71B formed in the base body 71 of the carrier 70, so that the first end section E1 and the second end section E2 of the second solid body joint 80B are rigidly connected to the carrier 70 (e.g. by means of a connection by means of a screw), and the central section F of the second solid body joint 80B is rigidly connected to the Gantry beam 15 through the opening 72B formed in the cover plate 72 of the carrier 70 (e.g. by means of a connection by means of a screw).

As suggested in FIGS. 6-9, the elongate hollow space 71A extends along the first plane ME1 in such a way that a longitudinal axis of the elongate hollow space 71A is arranged parallel to the first plane ME1 and perpendicular to the third direction Z, and the elongate hollow space 71A is laterally limited with respect to the first plane ME1 by means of side walls of the base body 71, which extend parallel to the first plane ME1 and perpendicular to the third direction Z. The side walls of the base body 71 limiting the elongate hollow space 71A, compared to the first solid body joint 80A, are thereby formed in such a way that the first end section E1 and the second end section E2 of the first solid body joint 80A are connected in a positive manner to the base body 71, while the central section F of the first solid body joint 80A has an extension in a direction perpendicular to the first plane ME1, which is smaller than the distance between a first wall section HSA1 of the base body 71 and a second wall section HSA2 of the base body 71 located opposite the first wall section HSA1 with respect to the first plane ME1, which wall sections HSA1 and HSA2 laterally limit the elongate hollow space 71A in the region of the central section F of the first solid body joint 80A.

To clarify the above-mentioned facts, the wall sections HSA1 and HSA2 of the base body 71, which laterally limit the elongate hollow space 71A, are each illustrated in FIG. 9 by means of a relatively thick black line (provided with the reference numeral HSA1 or HSA2, respectively): As can be seen in FIG. 9, the central section F of the first solid body joint 80A (in the undeformed base state of the solid body joint 80A) is arranged with respect to the first end section E1 and the second end section E2 of the first solid body joint 80A and with respect to the wall sections HSA1 and HSA2 of the elongate hollow space 71A in such a way that the central section F of the first solid body joint 80A is located approximately in a central position between the wall section HSA1 and the wall section HSA2 and thereby in each case has a distance from the wall section HSA1 as well as from the wall section HSA2 in a direction perpendicular to the first plane ME1.

The elongate hollow space 71B therefore extends along the second plane ME2 in such a way that a longitudinal axis of the elongate hollow space 71B is arranged parallel to the second plane ME2 and perpendicular to the third direction Z, and the elongate hollow space 71B is laterally limited with respect to the second plane ME2 by means of side walls of the base body 71, which extend parallel to the second plane ME2 and perpendicular to the third direction Z. The side walls of the base body 71 limiting the elongate hollow space 71B, compared to the second solid body joint 80B, are thereby formed in such a way that the first end section E1 and the second end section E2 of the second solid body joint 80B are connected in a positive manner to the base body 71, while the central section F of the second solid body joint 80B has an extension in a direction perpendicular to the second plane ME2, which is smaller than the distance between a first wall section HSB1 of the base body 71 and a second wall section HSB2 of the base body 71 located opposite the first wall section HSB1 with respect to the second plane ME2, which wall sections HSB1 and HSB2 laterally limit the elongate hollow space 71B in the region of the central section F of the second solid body joint 80B.

To clarify the above-mentioned facts, the wall sections HSB1 and HSB2 of the base body 71, which laterally limit the elongate hollow space 71B, are each illustrated in FIG. 9 by means of a relatively thick black line (provided with the reference numeral HSB1 or HSB2, respectively): As can be seen in FIG. 9, the central section F of the second solid body joint 80B (in the undeformed base state of the solid body joint 80B) is arranged with respect to the first end section E1 and the second end section E2 of the second solid body joint 80B and with respect to the wall sections HSB1 and HSB2 of the elongate hollow space 71B in such a way that the central section F of the second solid body joint 80B is located approximately in a central position between the wall section HSB1 and the wall section HSB2 and thereby in each case has a distance from the wall section HSB1 as well as from the wall section HSB2 in a direction perpendicular to the second plane ME2.

The first solid body joint 80A and the second solid body joint 80B are formed to hold the carrier 70 or the sliding element GE, respectively, in a stable rest position with respect to the Gantry beam 15, when both solid body joints 80A and 80B are each in their undeformed base state (as illustrated in FIG. 9). Due to the fact that the first web part S1 and the second web part S2 of the first solid body joint 80A and the first web part S1 and the second web part S2 of the second solid body joint 80B are each formed to be elastically deformable, and due to the fact that the central section F of the first solid body joint 80A (in the undeformed base state of the first solid body joint 80A) in each case has a distance from the wall section HSA1 as well as from the wall section HSA2 in a direction perpendicular to the first plane ME1, and the central section F of the second solid body joint 80B (in the undeformed base state of the second solid body joint 80B) additionally in each case has a distance from the wall section HSB1 as well as from the wall section HSB2 in a direction perpendicular to the second plane ME2, the carrier 70 or the sliding element GE, respectively, is held on the Gantry beam 15 by means of the first solid body joint 80A and the second solid body joint 80B in such a way that the carrier 70 or the sliding element GE, respectively, is movable relative to the Gantry beam 15, provided that the central section F of the first solid body joint 80A does not abut against one of the wall sections HSA1 or HSA2, respectively, and one of the wall sections HSA1 or HSA2, respectively, does not block a corresponding movement of the carrier 70 or of the sliding element GE, respectively, relative to the Gantry beam 15 and/or provided that the central section F of the second solid body joint 80B does not abut against one of the wall sections HSB1 or HSB2, respectively, and one of the wall sections HSB1 or HSAB2, respectively, does not block a corresponding movement of the carrier 70 or of the sliding element GE, respectively, relative to the Gantry beam 15.

A movement of the carrier 70 or of the sliding element GE, respectively, relative to the Gantry beam 15 has the effect that in response to this movement, the first web part S1 and the second web part S2 of the first solid body joint 80A and the first web part 51 and the second web part S2 of the second solid body joint 80B are elastically deformed and the central section F of the first solid body joint 80A is thereby moved relative to the first end section E1 of the first solid body joint 80A and to the second end section E2 of the first solid body joint 80A, and the central section F of the second solid body joint 80B is additionally moved relative to the first end section E1 of the second solid body joint 80B and to the second end section E2 of the second solid body joint 80B.

Due to the shape of the first solid body joint 80A, the central section F of the first solid body joint 80A, with respect to the first end section E1 and with respect to the second end section E2 of the first solid body joint 80A, has different degrees of freedom of movement, which correspond to movements of the central section F of the first solid body joint 80A in different directions with respect to the first end section E1 and the second end section E2 of the first solid body joint 80A. It is relevant in this context that the first solid body joint 80A has different stiffnesses in response to movements of the central section F in respective different directions with respect to the first end section E1 or the second end section E2, respectively, of the first solid body joint 80A (as a function of the direction of the movement). Due to the fact that in the case of the first solid body joint 80A, the first end section E1 as well as the second end section E2 of the first solid body joint 80A are rigidly connected to the carrier 70, the first solid body joint 80A has a relatively large stiffness with regard to a deformation of the first solid body joint 80A, in the case of which the central section F is moved in the direction of the longitudinal axis of the first solid body joint 80A (i.e. parallel to the first plane ME1) relative to the first end section E1 and to the second end section E2 of the first solid body joint 80A, especially since the first web part S1 or the second web part S2, respectively, of the first solid body joint 80A is essentially only subject to tension or to pressure, respectively, in the direction of the longitudinal axis of the first solid body joint 80A in response to a movement of this type of the central section F. On the other hand, the first solid body joint 80A has a relatively small stiffness with regard to deformations of the first solid body joint 80A, in the case of which the central section F is moved relative to the first end section E1 and to the second end section E2 of the first solid body joint 80A either linearly in a direction perpendicular to the first plane ME1 or is rotated about an axis of rotation extending in the third direction Z, especially since, in response to one of the above-mentioned movements of the central section F, the first web part S1 and the second web part S2 of the first solid body joint 80A are each loaded by a combination of tensile stress and bending about an axis extending in the third direction Z, and the first web part S1 and the second web part S1 have a particularly small stiffness with respect to a bending about an axis extending in the third direction Z.

Due to the shape of the second solid body joint 80B, the central section F of the second solid body joint 80B, with respect to the first end section E1 and the second end section E2 of the second solid body joint 80B, therefore has different degrees of freedom of movement, which correspond to movements of the central section F of the second solid body joint 80B in different directions with respect to the first end section E1 and the second end section E2 of the second solid body joint 80B.

Due to the fact that in the case of the second solid body joint 80B, the first end section E1 as well as the second end section E2 of the second solid body joint 80B are rigidly connected to the carrier 70, the second solid body joint 80B has a relatively large stiffness with regard to a deformation of the second solid body joint 80B, in the case of which the central section F is moved in the direction of the longitudinal axis of the second solid body joint 80B (i.e. parallel to the second plane ME2) relative to the first end section E1 and to the second end section E2 of the second solid body joint 80B, especially since, in response to a movement of this type of the central section F, the first web part S1 or the second web part S2, respectively, of the second solid body joint 80B is essentially exclusively subject to tension or to pressure, respectively, in the direction of the longitudinal axis of the second solid body joint 80B. On the other hand, the second solid body joint 80B has a relatively small stiffness with regard to deformations of the second solid body joint 80B, in the case of which the central section F is moved relative to the first end section E1 and to the second end section E2 of the second solid body joint 80B either linearly in a direction perpendicular to the second plane ME2 or is rotated about an axis of rotation extending in the third direction Z, especially since, in response to one of the above-mentioned movements of the central section F, the first web part S1 and the second web part S2 of the second solid body joint 80B are each loaded by a combination of tensile stress and bending about an axis extending in the third direction Z, and the first web part S1 and the second web part S2 have a particularly small stiffness with respect to a bending about an axis extending in the third direction Z.

In the case of the positioning device 1, it is of interest that the arrangement of the first solid body joint 80A and of the second solid body joint 80B represents a connection between the carrier 70 or the sliding element GE, respectively, and the Gantry beam 15, which, on the one hand, ensures a highest possible stiffness with regard to a translation of the carrier 70 or of the sliding element GE, respectively, relative to the Gantry beam 15 in the first direction X and in the second direction Y and in the third direction Z, but, on the other hand, has a smallest possible stiffness with regard to a rotation of the carrier 70 or of the sliding element GE, respectively, relative to the Gantry beam 15 about an axis of rotation extending in the third direction Z.

In order to fulfill the above-mentioned requirements, the first solid body joint 80A and the second solid body joint 80B are arranged relative to one another on the carrier 70 in such a way that the first plane ME1 and the second plane ME2 are not arranged parallel to one another but are inclined relative to one another in such a way that the first plane ME1 and the second plane ME2 form a common section line DZ, which extends parallel to the third direction Z (as illustrated in FIG. 9). In this case, with respect to the common section line DZ, the first plane ME1 and the second plane ME2 form an angle α, which has to be greater than 0° and smaller than 180°. In order to ensure a sufficiently high stiffness of the arrangement of the first solid body joint 80A and of the second solid body joint 80B with respect to a translation of the carrier 70 or of the sliding element GE, respectively, relative to the Gantry beam 15 in the first direction X and in the second direction Y, the angle α should preferably fulfill the condition 30°≤α≤90°.

Figure 8:
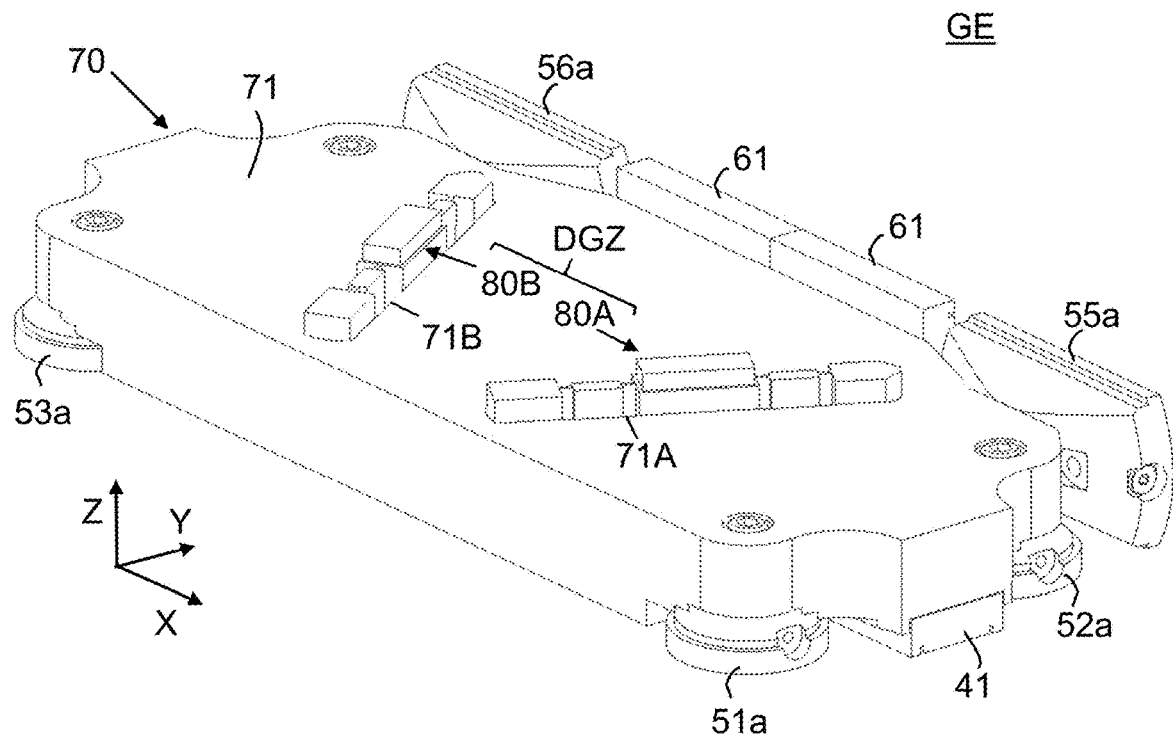
FIG. 8 shows a perspective view of the third air bearing arrangement of the first air bearing means according to FIG. 3, in an enlarged illustration.

In the case of the example illustrated in FIGS. 6, 8, and 9, the angle α is approx. 60°.

An arrangement of the first solid body joint 80A and of the second solid body joint 80B in such a way that the first plane ME1 and the second plane ME2 form an angle α of approx. 60° with respect to the common section line DZ, represents a good compromise in the present case in such a way that the stiffness of the arrangement of the first solid body joint 80A and of the second solid body joint 80B with respect to a rotation of the carrier 70 or of the sliding element GE, respectively, relative to the Gantry beam 15 about the common section line DZ of the first plane ME1 and of the second plane ME2 is sufficiently small, and the stiffness of the arrangement of the first solid body joint 80A and of the second solid body joint 80B with respect to a translation of the carrier 70 or of the sliding element GE, respectively, relative to the Gantry beam 15 in the first direction X and in the second direction Y is sufficiently high.

In this context, the common section line DZ of the first plane ME1 and of the second plane ME2 form a "virtual" axis of rotation (which extends in the third direction Z), about which the carrier 70 or the sliding element GE, respectively, is rotatably mounted relative to the Gantry beam 15 by means of the arrangement of the first solid body joint 80A and of the second solid body joint 80B.

As suggested in FIG. 9, the "virtual" axis of rotation DZ can spatially extend in such a way that the axis of rotation DZ is arranged outside of the carrier 70 or of the sliding element GE, respectively. The spatial arrangement of the first solid body joint 80A and of the second solid body joint 80B can therefore be suitably selected as needed, in order to realize a certain specified position of the axis of rotation DZ.

As suggested in FIG. 9, the first solid body joint 80A and the second solid body joint 80B are arranged symmetrically with respect to a third plane E3, which extends parallel to the second direction Y and parallel to the third direction Z. An arrangement of this type has the advantage that the first solid body joint 80A and the second solid body joint 80B are in each case loaded in the same way in response to an acceleration of the movable element 5 in the second direction Y.

In the present example, the wall sections HSA1 and HSA2 of the base body 71, which laterally limit the elongate hollow space 71A, can be arranged in such a way that the wall section HSA1 and/or the wall section HSA2 has a distance from the central section F of the first solid body joint 80A (which is rigidly connected to the Gantry beam 15), when the first solid body joint 80A is in the undeformed base state, and that the wall section HSA1 and/or the wall section HSA1 can be brought into contact with the central section F of the first solid body joint 80A by means of a rotation of the carrier 70 about a specified maximum angle of rotation about the "virtual" axis of rotation DZ, so that the central section F of the first solid body joint 80A forms a mechanical stop for the carrier 70, which limits the rotation of the carrier 70 (FIG. 9).

In the present example, the wall sections HSB1 and HSB2 of the base body 71, which laterally limit the elongate hollow space 71B, can be arranged in an analogous manner in such a way that the wall section HSB1 and/or the wall section HSB2 has a distance from the central section F of the second solid body joint 80B (which is rigidly connected to the Gantry beam 15), when the second solid body joint 80B is in the undeformed base state, and that the wall section HSB1 and/or the wall section HSB2 can be brought into contact with the central section F of the second solid body joint 80B by means of a rotation of the carrier 70 about a specified maximum angle of rotation about the "virtual" axis of rotation DZ, so that the central section F of the second solid body joint 80B forms a mechanical stop for the carrier 70, which limits the rotation of the carrier 70 (FIG. 9).

Due to a suitable selection of the arrangement of the wall sections HSA1 and/or HSA2 and/or HSB1 and/or HSB2 of the base body 71, a maximum angle of rotation can therefore be specified, about which the carrier 70 can be rotated from its rest position about the "virtual" axis of rotation DZ. The first solid body joint 80A and the second solid body joint 80B can be protected against a mechanical overload in this way. In the case of the positioning device 1, it can be expedient, for example, that the carrier 70 can be rotated relative to the Gantry beam 15 about the "virtual" axis of rotation DZ at least about an angle of ±0.1°.

As can be seen from FIGS. 11 and 13, the air bearings 121-124, 140, and 141 of the second air bearing means LL2 are arranged relative to the movable element 5 and relative to the Gantry beam 15 and relative to the respective air bearings of the first air bearing means LL1 in such a way that none of the air bearings 121-124, 140, and 141 of the second air bearing means LL2 can collide with one of the air bearings of the first air bearing means LL1, when the movable element 5 is moved in the second direction Y.

The movable element 5 can thus be moved in the second direction—guided by means of the air bearings of the second air bearings means LL2—essentially along the entire extension of the Gantry beam 15 in the second direction Y, e.g. in the direction of the first end 15.1 so far until the lateral air bearing 140 of the second air bearing means LL2 reaches the first end 15.1 of the Gantry beam 15 (as suggested in FIG. 11 by means of a double arrow extending between the lateral air bearing 140 and the first end 15.1 of the Gantry beam 15), and in the direction of the second end 15.2 so far until the lateral air bearing 141 of the second air bearing means LL2 reaches the second end 15.2 of the Gantry beam 15 (as suggested in FIG. 11 by means of a double arrow extending between the lateral air bearing 141 and the second end 15.2 of the Gantry beam 15).

As can be seen from FIGS. 12 and 13, the movable element 5 is guided on the Gantry beam 15 by means of the air bearings of the second air bearing means LL2 in such a way that the movable element 5 is laterally guided by means of the lateral air bearings 140 or 141, respectively, exclusively on the one flat side surface SFG2 of the Gantry beam 15, while the side surface SFG1 of the Gantry beam 15 located opposite the flat side surface SFG2 in the first direction X can be accessed freely. The side surface SFG1 of the Gantry beam 15 thus provides the option of fastening, for example, supply lines for supplying the air bearings of the first air bearing means LL1 and the second air bearings means LL2 with compressed air and/or electrical lines for supplying the linear drives of the two first linear axes X1 and X2 and the linear drive of the second linear axis Y1 with electrical energy to the flat side surface SFG2 (corresponding supply lines or electrical lines, respectively, are not illustrated in the figures).

Due to the fact that the movable element 5 is guided exclusively on the Gantry beam 15 (and not on the flat guide surface FF of the base B) by means of the air bearings of the second air bearing means LL2 in response to a movement in the second direction Y, the base B of the positioning device 1 provides space on the upper side of the base B, for guiding the supply lines fastened to the flat side surface SFG2, for supplying the air bearings of the first air bearing means LL1 and of the second air bearing means LL2 with compressed air and/or the electrical lines fastened to the flat side surface SFG2 for supplying the linear drives of the two first linear axes X1 and X2 and the linear drive of the second linear axis Y1 with electrical energy, through a trough-like depression VX, which is formed on the top side of the base B and which, according to the embodiment of the positioning device 1 illustrated in FIGS. 1, 2, 5, and 12, extends linearly between the second section FF2 and the third section FF3 of the flat guide surface FF in the first direction X.

The above-mentioned measures provide for an arrangement of all components of the positioning device 1 in such a way that the positioning device 1 is constructed in a compact manner (with a relatively small base surface, via which the respective parts of the positioning device 1 are arranged so as to be spatially distributed).

Although only a few embodiments of the present invention have been shown and described, it is to be understood that many changes and modifications may be made thereunto without departing from the spirit and scope of the invention.

What is claimed is:

1. A positioning device (1) for positioning a movable element (5), comprising:
   a base (B) comprising a flat guide surface (FF), which is arranged parallel to a first direction (X) and parallel to a second direction (Y);
   a first movement means (10) in Gantry design, which first movement means comprises a Gantry beam (15) arranged above the flat guide surface (FF) and extending in the second direction (Y) at a distance from the flat guide surface (FF), and a Gantry drive (GA) for moving the Gantry beam relative to the base (B) in the first direction (X), wherein the Gantry beam (15) has a first end (15.1) and a second end (15.2) located opposite the first end (15.1), and the Gantry drive (GA) comprises two first linear axes (X1, X2) extending in the first direction (X), each comprising a linear drive (LMX1, LMX2), wherein the linear drive (LMX1) of one of the two first linear axes (X1, X2) is connected to the first end (15.1) of the Gantry beam (15), and the linear drive (LMX2) of the other one of the two first linear axes (X1, X2) is connected to the second end (15.2) of the Gantry beam (15);
   a first air bearing means (LL1) comprising several air bearings connected to the Gantry beam (15) for guiding the Gantry beam on the flat guide surface (FF) of the base (B);
   wherein the movable element (5) is mounted on the Gantry beam (15) in such a way that the movable element (5) is linearly movable in the second direction (Y) on the Gantry beam (15), and the Gantry beam (15) has a second linear axis (Y1) extending in the second direction (Y) and comprising a linear drive (LMY) connected to the movable element (5) for moving the movable element (5) in the second direction (Y);
   wherein the first air bearing means (LL1) has a first air bearing arrangement (30), which comprises at least one first horizontal air bearing (31, 32) arranged on the first end (15.1) of the Gantry beam (15) for guiding the first end (15.1) of the Gantry beam (15) on a first section (FF1) of the flat guide surface (FF) extending in the first direction (X), which at least one first horizontal air bearing (31, 32) is preloaded with respect to the first section (FF1) of the flat guide surface (FF);
   wherein the first air bearing means (LL1) has a second air bearing arrangement (35), which comprises at least one second horizontal air bearing (36, 37) arranged on the second end (15.2) of the Gantry beam (15) for guiding the second end (15.2) of the Gantry beam on a second section (FF2) of the flat guide surface (FF) extending in the first direction (X), which at least one second horizontal air bearing (36, 37) is preloaded with respect to the second section (FF2) of the flat guide surface (FF);
   wherein the first air bearing means (LL1) has a third air bearing arrangement (50), which comprises at least one third horizontal air bearing (51, 52) and at least one fourth horizontal air bearing (53, 54), wherein the at least one third horizontal air bearing (51, 52) and the at least one fourth horizontal air bearing (53, 54) are arranged on a central section of the Gantry beam (15) between the first end (15.1) of the Gantry beam (15) and the second end (15.2) of the Gantry beam (15), so that the central section of the Gantry beam is guided on a third section (FF3) of the flat guide surface (FF) by means of the third horizontal air bearing (51, 52) and of the fourth horizontal air bearing (53, 54), which third section (FF3) of the flat guide surface (FF) extending in the first direction (X) and, with respect to the second direction (Y), being arranged between the first section (FF1) of the flat guide surface (FF) and the second section (FF2) of the flat guide surface (FF), wherein the at least one third horizontal air bearing (51, 52) and the at least one fourth horizontal air bearing (53, 54) have a distance relative to one another in the first direction (X), and the at least one third horizontal air bearing (51, 52) and the at least one fourth horizontal air bearing (53, 54) are preloaded with respect to the third section (FF3) of the flat guide surface (FF);
   wherein a guide beam (FB) extending in the first direction (X) is arranged on the base (B) next to the third section (FF3) of the flat guide surface (FF), the guide beam (FB) having a flat side surface (SF), which extends parallel to the first direction (X) and parallel to a third direction (Z), which third direction (Z) being directed essentially perpendicular to the flat guide surface (FF); and
   wherein the third air bearing arrangement (50) comprises at least one lateral air bearing (55, 56) arranged on the central section of the Gantry beam (15) for guiding the Gantry beam (15) on the one flat side surface (SF) of the guide beam (FB), wherein the at least one lateral air bearing (55, 56) is preloaded with respect to the one flat side surface (SF) of the guide beam (FB).

2. The positioning device (1) according to claim 1, wherein the third air bearing arrangement (50) comprises two third horizontal air bearings (51, 52) and two fourth horizontal air bearings (53, 54) for guiding the central section of the Gantry beam (15) on the third section (FF3) of the flat guide surface (FF), wherein the two third horizontal air bearings (51, 52) are arranged relative to one another in such a way that the two third horizontal air bearings (51, 52) have a distance relative to one another in the second direction (Y), and the two fourth horizontal air bearings (53, 54) are arranged relative to one another in such a way that the two fourth horizontal air bearings (53, 54) have a distance relative to one another in the second direction (Y), and wherein the two third horizontal air bearings (51, 52) and the two fourth horizontal air bearings (53, 54) are preloaded with respect to the third section (FF3) of the flat guide surface (FF).

3. The positioning device (1) according to claim 1,
wherein the third air bearing arrangement (50) comprises two lateral air bearings (55, 56) for guiding the Gantry beam (15) on the flat side surface (SF) of the guide beam (FB), wherein the two lateral air bearings (55, 56) are arranged relative to one another in such a way that they have a distance relative to one another in the first direction (X), and wherein the two lateral air bearings (55, 56) are preloaded with respect to the flat side surface (SF) of the guide beam (FB).

4. The positioning device (1) according to claim 1, wherein
each third horizontal air bearing (51, 52) of the third air bearing arrangement (50), each fourth horizontal air bearing (53, 54) of the third air bearing arrangement (50), and each lateral air bearing (55, 56) of the third air bearing arrangement (50), are fastened to a common carrier (70), which carrier (70) is fastened to the Gantry beam (15), so that the third air bearing arrangement (50) is held on the Gantry beam (15) by means of the carrier (70).

5. The positioning device (1) according to claim 4, wherein the carrier (70) is arranged below the Gantry beam (15) in an intermediate space between the Gantry beam (15) and the flat guide surface (FF).

6. The positioning device (1) according to claim 4, wherein the carrier (70) is rotatably mounted on the Gantry beam (5) in such a way that the carrier (70), together with each third horizontal air bearing (51, 52) of the third air bearing arrangement (50), each fourth horizontal air bearing (53, 54) of the third air bearing arrangement (50), and each lateral air bearing (55, 56) of the third air bearing arrangement (50), is configured to be rotated relative to the Gantry beam (15) about an axis of rotation (DZ) extending in the third direction (Z).

7. The positioning device (1) according to claim 4, wherein the carrier (70) is connected to the Gantry beam (15) via a rotary joint (DGZ), which is formed of one or several solid body joints (80A, 80B).

8. The positioning device (1) according to claim 1,
wherein the first air bearing arrangement (30) comprises two first horizontal air bearings (31, 32) for guiding the first end (15.1) of the Gantry beam on the first section (FF1) of the flat guide surface (FF), wherein the two first horizontal air bearings (31, 32) are arranged relative to one another in such a way that the two first horizontal air bearings (31, 32) have a distance relative to one another in the first direction (X), and wherein the two first horizontal air bearings (31, 32) are preloaded with respect to the first section (FF1) of the flat guide surface (FF).

9. The positioning device (1) according to claim 1,
wherein the second air bearing arrangement (35) comprises two second horizontal air bearings (36, 37) for guiding the second end (15.2) of the Gantry beam (15) on the second section (FF2) of the flat guide surface (FF), wherein the two second horizontal air bearings (36, 37) are arranged relative to one another in such a way that the two second horizontal air bearings (36, 37) have a distance relative to one another in the first direction (X), and wherein the two second horizontal air bearings (36, 37) are preloaded with respect to the second section (FF2) of the flat guide surface (FF).

10. The positioning device (1) according to claim 1, comprising a second air bearing means (LL2) comprising several air bearings connected to the movable element (5) for guiding the movable element (5) on the Gantry beam (15).

11. The positioning device (1) according to claim 10,
wherein the Gantry beam (15) has a flat guide surface (FFG1, FFG2), which is arranged parallel to the first direction (X) and parallel to the second direction (Y), and the Gantry beam (15) has a flat side surface (SFG2), which extends parallel to the second direction (Y) and parallel to a third direction (Z), which third direction (Z) is directed essentially perpendicular to the flat guide surface (FFG1, FFG2) of the Gantry beam (15), and wherein the second air bearing means (LL2) comprises at least one first horizontal air bearing (121, 122) and at least one second horizontal air bearing (123, 124), which at least one first horizontal air bearing (121, 122) and which at least one second horizontal air bearing (123, 124) are arranged on the movable element (5) in such a way that the movable element (5) is guided on the flat guide surface (FFG1, FFG2) of the Gantry beam (15) by means of the at least one first horizontal air bearing (121, 122) and by means of the at least one second horizontal air bearing (123, 124) of the second air bearing means (LL2), wherein the at least one first horizontal air bearing (121, 122) has a distance in the second direction (Y) relative to the at least one second horizontal air bearing (123, 124) of the second air bearing means (LL2), and the at least one first horizontal air bearing (121, 122) and the at least one second horizontal air bearing (123, 124) of the second air bearing means (LL2) are preloaded with respect to the flat guide surface (FFG1, FFG2) of the Gantry beam (15), and wherein the second air bearing means (LL2) comprises at least one lateral air bearing (140, 141) arranged on the movable element (5) for guiding the movable element (5) on the one flat side surface (SFG2) of the Gantry beam (15), and the at least one lateral air bearing (140, 141) of the second air bearing means (LL2) is preloaded with respect to the one flat side surface (SFG2) of the Gantry beam (15).

12. The positioning device (1) according to claim 11,
wherein the second air bearing means (LL2) comprises two first horizontal air bearings (121, 122) arranged on the movable element (5) for guiding the movable element (5) on the flat guide surface (FFG1, FFG2) of the Gantry beam (15), wherein the two first horizontal air bearings (121, 122) of the second air bearing means (LL2) have a distance relative to one another in the first direction (X) and are preloaded with respect to the flat guide surface (FFG1, FFG2) of the Gantry beam (15); and/or wherein the second air bearing means (LL2) comprises two second horizontal air bearings (123, 124) arranged on the movable element (5) for guiding the movable element (5) on the flat guide surface (FFG1, FFG2) of the Gantry beam (5), wherein the two second horizontal air bearings (123, 124) of the second air bearing means (LL2) have a distance relative to one another in the first direction (X) and are preloaded with respect to the flat guide surface (FFG1, FFG2) of the Gantry beam (15); and/or wherein the second air bearing means (LL2) comprises two lateral air bearings (140, 141) arranged on the movable element (5) for guiding the movable element (5) on the one flat side surface (SFG2) of the Gantry beam (15), wherein the two lateral air bearings (140, 141) of the second air bearing means (LL2) have a distance relative to one another in the second direction (Y) and are preloaded with respect to the flat side surface (SFG2) of the Gantry beam (15).

13. The positioning device (1) according to claim 11, wherein the at least one first horizontal air bearing (121, 122) and the at least one second horizontal air bearing (123, 124) of the second air bearing means (LL2) are preloaded by means of magnetic means (150, 151) with respect to the flat guide surface (FFG) of the Gantry beam (15), and/or the at least one lateral air bearing (140, 141) of the second air bearing means (LL2) is preloaded by means of magnetic means (160, 161) with respect to the one flat side surface (SFG2) of the Gantry beam (15).

14. The positioning device (1) according to claim 1, wherein the at least one first horizontal air bearing (31, 32) of the first air bearing arrangement (30) is preloaded by means of magnetic means (40, 41, 42) with respect to the first section (FF1) of the flat guide surface (FF) of the base (B), and/or the at least one second horizontal air bearing (36, 37) of the second air bearing arrangement (35) is preloaded by means of magnetic means (40, 41, 42) with respect to the second section (FF2) of the flat guide surface (FF), and/or the at least one third horizontal air bearing (51, 52) of the third air bearing arrangement (50) and the at least one fourth horizontal air bearing (53, 54) of the third air bearing arrangement (50) are preloaded by means of magnetic means (40, 41, 42) with respect to the third section (FF3) of the flat guide surface (FF), and/or the at least one lateral air bearing (55, 56) of the third air bearing arrangement (50) is preloaded by means of magnetic means (60, 61) with respect to the one flat side surface (SF) of the guide beam (FB).

15. The positioning device (1) according to claim 4, comprising a first solid body joint (80A) comprising a first elongate solid body, which extends perpendicular to the third direction (Z) along a first plane (ME1) being parallel to the third direction (Z), and which has a longitudinal axis arranged perpendicular to the third direction (Z), wherein the first elongate solid body has the following longitudinal sections, which are arranged one behind another in the direction of the longitudinal axis of the first elongate solid body:

a first end section (E1), which forms a first end of the first elongate solid body;

a second end section (E2), which forms a second end of the first elongate solid body located opposite the first end of the first elongate solid body in the direction of the longitudinal axis of the first elongate solid body;

a central section (F) arranged between the first end section and the second end section of the first elongate solid body;

a first web part (S1) arranged between the first end section (E1) and the central section (F) of the first elongate solid body, the first web part (S1) being connected to the first end section (E1) and the central section (F);

a second web part (S2) arranged between the second end section (E2) and the central section (F), the second web part (S2) being connected to the second end section (E2) and the central section (F) of the first elongate solid body;

comprising a second solid body joint (80B), comprising a second elongate solid body, which extends perpendicular to the third direction (Z) along a second plane (ME2) being parallel to the third direction (Z), and which has a longitudinal axis arranged perpendicular to the third direction (Z), wherein the second elongate solid body has the following longitudinal sections, which are arranged one behind another in the direction of the longitudinal axis of the second elongate solid body:

a first end section (E1), which forms a first end of the second elongate solid body;

a second end section (E2), which forms a second end of the second elongate solid body located opposite the first end of the second elongate solid body in the direction of the longitudinal axis of the second elongate solid body;

a central section (F) arranged between the first end section and the second end section of the second elongate solid body;

a first web part (S1) arranged between the first end section (E1) and the central section (F) of the second elongate solid body, the first web part (S1) being connected to the first end section and the central section;

a second web part (S2) arranged between the second end section (E2) and the central section (F) of the second elongate solid body, the second web part (S2) being connected to the second end section (E1) and the central section (F) of the first elongate solid body, wherein the carrier (70) is connected to the Gantry beam (15) via the first solid body joint (80A) and the second solid body joint (80B) in such a way that the first end section (E1) of the first elongate solid body and the second end section (E2) of the first elongate solid body are rigidly connected to the carrier (70), and the central section (F) of the first elongate solid body is rigidly connected to the Gantry beam (15), and that the first end section (E1) of the second elongate solid body and the second end section (E2) of the second elongate solid body are rigidly connected to the carrier (70), and the central section (F) of the second elongate solid body is rigidly connected to the Gantry beam (15), wherein the first plane (ME1) and the second plane (ME2) are inclined relative to one another in such a way that the first plane (ME1) and the second plane (ME2) form a common section line (DZ), which extends parallel to the third direction (Z),
wherein the first web part (S1) and the second web part (S2) of the first solid body joint (80A), and the first web part (S1) and the second web part (S2) of the second solid body joint (80B) are formed so as to be elastically deformable, so that the central section (F) of the first solid body joint (80A) is configured to be moved relative to the first end section (E1) of the first solid body joint (80A) and to the second end section (E2) of the first solid body joint (80A), and the central section (F) of the second solid body joint (80B) is configured to be moved relative to the first end section (E1) of the second solid body joint (80B) and to the second end section (E2) of the second solid body joint (80B), wherein the carrier (70) is rotatably mounted about the common section line (DZ) of the first plane (ME1) and of the second plane (ME2) on the Gantry beam (15) by means of the first solid body joint (80A) and the second solid body joint (80B).

16. The positioning device (1) according to claim 15, wherein the first solid body joint (80A) and the second solid body joint (80B) are arranged symmetrically with respect to a third plane (E3), which extends parallel to the second direction (Y) and parallel to the third direction (Z).

17. The positioning device (1) according to claim 15, wherein the carrier (70) has at least one hollow space (71A, 71B), in which the first solid body joint (80A) and/or the second solid body joint (80B) is arranged.

18. The positioning device (1) according to claim 15, wherein the carrier (70) is held in a rest position with respect to the Gantry beam (15) by means of the first solid body joint (80A) and of the second solid body joint (80B) in such a way that the carrier (70) is configured to be moved out of the rest position by means of a rotation of the carrier (70) relative to the Gantry beam (15) about the common section line (DZ) of the first plane (ME1) and of the second plane (ME2).

19. The positioning device (1) according to claim 18, wherein the carrier (70) has at least one stop element (HSA1, HSA2), which is arranged in such a way that the stop element (HSA1, HSA2) has a distance from the central section (F) of the first solid body joint (80A), when the carrier (70) is arranged in the rest position relative to the Gantry beam (15), and which stop element (HSA1, HSA2) is configured to be brought into contact with the central section (F) of the first solid body joint (80A) by means of a rotation of the carrier (70) about a specified maximum angle of rotation about the common section line (DZ) of the first plane (ME1) and of the second plane (ME2), so that the central section (F) of the first solid body joint (80A) forms a mechanical stop for the carrier (70), which limits the rotation of the carrier (70); and/or
wherein the carrier (70) has at least one stop element (HSB1, HSB2), which is arranged in such a way that the stop element (HSB1, HSB2) has a distance from the central section (F) of the second solid body joint (80B), when the carrier (70) is arranged in the rest position relative to the Gantry beam (15), and which stop element (HSB1, HSB2) is configured to be brought into contact with the central section (F) of the second solid body joint (80B) by means of a rotation of the carrier (70) about a specified maximum angle of rotation about the common section line (DZ) of the first plane (ME1) and of the second plane (ME2), so that the central section (F) of the second solid body joint (80B) forms a mechanical stop for the carrier (70), which limits the rotation of the carrier (70).

20. The positioning device (1) according to claim 1, wherein each linear drive (LMX1, LMX2) of the two first linear axes (X1, X2) is a linear motor and/or the linear drive (LMY) of the second linear axis (Y1) is a linear motor.

* * * * *